United States Patent [19]
Martin et al.

[11] Patent Number: 5,725,970
[45] Date of Patent: *Mar. 10, 1998

[54] BROAD BAND REFLECTION HOLOGRAMS AND A DRY PROCESS FOR MAKING SAME

[75] Inventors: Paul James Martin, Gloucester City, N.J.; Robert George Melega; Andrew Michael Weber, both of Wilmington, Del.

[73] Assignee: E. I. du Pont de Nemours and Company, Wilmington, Del.

[*] Notice: The term of this patent shall not extend beyond the expiration date of Pat. No. 5,415,950.

[21] Appl. No.: 714,505

[22] Filed: Sep. 16, 1996

Related U.S. Application Data

[63] Continuation of Ser. No. 590,251, Jan. 23, 1996, abandoned, which is a continuation of Ser. No. 335,020, Nov. 7, 1994, abandoned.

[51] Int. Cl.$^6$ .................................................. G03H 1/04
[52] U.S. Cl. ........................... 430/2; 430/1; 430/290; 430/330; 359/3
[58] Field of Search ........................ 359/1, 3; 430/1, 430/2, 290, 330, 331

[56] References Cited

U.S. PATENT DOCUMENTS

| | | | |
|---|---|---|---|
| 3,479,185 | 11/1969 | Chambers, Jr. | 96/84 |
| 3,532,406 | 10/1970 | Hartman | 350/3.5 |
| 3,652,275 | 3/1972 | Baum et al. | 96/48 |
| 3,784,557 | 1/1974 | Cescon | 260/309 |
| 4,162,162 | 7/1979 | Dueber | 96/115 P |
| 4,311,783 | 1/1982 | Dessauer | 430/270 |
| 4,492,102 | 1/1985 | Keys et al. | 430/1 |
| 4,547,002 | 10/1985 | Colgate, Jr. | 283/91 |
| 4,622,286 | 11/1986 | Sheets | 430/343 |
| 4,878,719 | 11/1989 | Wreede et al. | 350/3.75 |
| 4,913,990 | 4/1990 | Rallison | 430/30 |
| 4,917,977 | 4/1990 | Smothers | 430/2 |
| 4,942,112 | 7/1990 | Monroe et al. | 430/1 |
| 4,950,567 | 8/1990 | Keys et al. | 430/1 |
| 4,959,284 | 9/1990 | Smothers et al. | 430/2 |
| 4,959,293 | 9/1990 | Schwartzkopf et al. | 430/189 |
| 4,963,471 | 10/1990 | Trout et al. | 430/282 |
| 4,978,593 | 12/1990 | Yin et al. | 430/2 |
| 4,987,230 | 1/1991 | Monroe | 546/94 |
| 4,995,685 | 2/1991 | Armstrong et al. | 350/3.65 |
| 4,995,686 | 2/1991 | Blonder et al. | 350/96.15 |
| 5,024,909 | 6/1991 | Smothers et al. | 430/2 |
| 5,087,510 | 2/1992 | Tokas et al. | 428/209 |
| 5,096,790 | 3/1992 | Monroe | 430/1 |
| 5,128,779 | 7/1992 | Mallik | 359/2 |
| 5,161,829 | 11/1992 | Detrick et al. | 283/91 |
| 5,182,180 | 1/1993 | Gambogi, Jr. et al. | 430/2 |
| 5,278,008 | 1/1994 | Moss et al. | 430/1 |
| 5,279,689 | 1/1994 | Shvartzman | 156/220 |
| 5,415,950 | 5/1995 | King et al. | 430/2 |
| 5,500,311 | 3/1996 | King et al. | 430/1 |

FOREIGN PATENT DOCUMENTS

| | | | |
|---|---|---|---|
| 0 407 772 | 1/1991 | European Pat. Off. | G03H 1/18 |
| 58-200275 | 11/1993 | Japan | G03H 1/04 |
| WO 89/01016 | 2/1989 | WIPO | C09D 5/29 |

OTHER PUBLICATIONS

Rich, C. et al, "Broadband IR Lippmann Holograms for Solar Control Applications," *Proc. SPIE Practical Holography VI*, 1667 (1992).

Boj. P.G. et al, "Broadband reflection holograms in dichromated gelatin", *Applied Optics*, 31(17), 3302–3305 (1992).

Jannson, T. et al, "Lippmann–Bragg broadband holographic mirrors", *J. Opt. Soc. Am. A.*, 8(1), 201–211 (1991).

(List continued on next page.)

*Primary Examiner*—Martin Angebranndt
*Attorney, Agent, or Firm*—Thomas H. Magee

[57] ABSTRACT

Broad band reflection holograms and process for producing broad band reflection holograms in photosensitive elements comprising photopolymer photosensitive layers are disclosed. These holograms may be used to form very bright display holograms, ultraviolet, visible and infrared rejection filters, and holographic security devices, as well as may be used in a wide variety of other applications.

17 Claims, 4 Drawing Sheets

OTHER PUBLICATIONS

Rallison, R. D., "Novel Enhancement of Photopolymers", *SPIE Practical Holography IV*, 1212, 13–19 (1990).

Solymer, L. et al. *Volume Holography and Volume Gratings*, Chap. 10, 254–304, Academic Press, New York. (1981).

Monroe, B.M. et al, "Photopolymers for Holography and Waveguide Applications", *Polymers for Lightwave and Integrated Optics: Technology and Applications, Part I: Foundations*, L.A. Hornak, Ed., Marcel Dekker, New York, pp. 145–170 (1992).

Proceedings: "Practical Holography VIII. Materials and Processing", *Proc. SPIE*, Vol. 2176, San Jose, CA, Feb. 1994 Titles of Talks only.

Dietliker, K.K., "Free Radical Polymerization", *Chemistry and Technology of UV and EB Formulation for Coatings, Inks, and Paints*, 3, P.K.T. Oldring, Ed., SITA Technology, London, pp 1–525 (1991).

Guest, C.C., "Holography", *Enclycopedia of Physical Science & Technology*, 6, R. A. Meyers, Ed., Academic Press, Orlando, FL, pp. 507–519 (1987).

Denisyuk, Y.N., "Photographic Reconstruction of the Optical Properties of an Object in its Own Scattered Radiation Field", *Soviet Physics–Doklady*, 7(6), 543–545 (1962).

Kurtz, C.N., "Copying Reflection Holograms", *J. Optical Society of America*, 58, 856–857 (1968).

Database WPI, Section CH, Week 8834, Derwent Publications Ltd., London, GB; Class A82, AN 88-239218 (JP 63-172779, Mitsubishi Motor Corp., Jul. 16, 1988).

Patent Abstracts of Japan, Vol. 018, No. 284 (P-175), May 30, 1994 (JP 06-051682, Tootsuya:KK, Feb. 25, 1994).

Patent Abstracts of Japan, Vol. 018, No. 201 (C-1188), Apr. 8, 1994 (JP 06-002300, Aica Kogyo Co. Ltd., Jan. 11, 1994).

BROAD BAND REFLECTION HOLOGRAMS AND A DRY PROCESS FOR MAKING SAME

This is a continuation of application Ser. No. 08/590,251 filed Jan. 23, 1996, now abandoned which is a continuation of application Ser. No. 08/335,020 filed Nov. 7, 1994, now abandoned.

BACKGROUND OF THE INVENTION

1. Field of the Invention

This invention relates to broad band reflection holograms and a process for producing broad band reflection holograms.

2. Description of Related Art

The existence of, and methods of forming, broad band holograms having bandwidths of 100–200 nanometers (nm) or higher in dichromated gelatin holographic recording films is known. Some references which teach this phenomenon are: 1) "Broadband IR Lippmann Holograms for Solar Control Applications," C. Rich and J. Peterson, Proc. SPIE, Vol. 1667, 1993, 2) "Broadband reflection holograms in dichromated gelatin," P. G. Boj, J. Crespo and J. A. Quintana, Applied Optics, Vol. 31, no. 17, 1992, pages 3302–3305, and 3) "Lippmann-Bragg broadband holographic mirrors," T. Jannson, I. Tengara, Y. Qiao and G. Savant, J. Opt. Soc. Am. A, Vol. 8, no. 1, pages 201–211, January 1991.

Broad band reflection holograms having bandwidths greater than 100 nanometers have also been made in photopolymers in wet processes by dipping a photopolymer imaged to contain a reflection hologram in a liquid bath containing a swelling agent. See U.S. Pat. No. 4,913,990 and the article "Novel Enhancement of Photopolymers," by Richard D. Rallison, SPIE Vol. 1212 Practical Holography IV, pages 13–19 (1990). Such wet processes are messy. Solvents used as swelling agents present environmental concerns both with regard to exposure to individuals involved in performing the processes and in disposal of the spent liquids. Repeatablity in wet processes is poor. Wet processes are difficult, if not impossible, to control to obtain resulting holograms that are not fully swelled. When fully swelled, holographic materials have a tendency to partially dissolve thereby either partially or completely washing out the hologram. Further, generally speaking, wet processes are more time consuming and less suitable for mass production than dry processes.

Prior art photopolymer reflection holograms made by dry processes, such as holographic mirrors, reflect only narrow bandwidths, such as, up to at most 50 nm at 20% reflectance of radiation. This property has advantages in certain applications such as coherent optics, holographic notch filters, and head-up displays. In other applications, such as solar rejection filters, reflection of a broader bandwidth of radiation is required.

SUMMARY OF THE INVENTION

The invention relates to an element comprising a photohardened photopolymer layer containing a broad band reflection hologram having a reflection bandwidth greater than 60 nm at 20% reflection efficiency and a diffusion element having a dry diffusion layer on the photopolymer layer.

The invention is further directed to a dry process for making a broad band reflection hologram in a photopolymer layer, the hologram having a final reflection bandwidth of at least 60 nm at 20% reflection efficiency, comprising:

imaging the photopolymer layer to form an imaged layer containing a reflection hologram having an initial reflection bandwidth less than the final bandwidth;

applying a diffusion layer to the imaged layer, the diffusion layer comprising a monomer selected from a group consisting of a polymerizable monomer that contains at least two methacrylate groups, pentaerythritol triacrylate, trimethylolpropane triacrylate, ethoxylated bisphenol A diacrylate, and hexamethylene diol diacrylate; and heating the imaged layer with the applied diffusion layer at 100° C. or more for at least 2 minutes to form the broad band reflection hologram having the final bandwidth.

BRIEF DESCRIPTION OF THE DRAWINGS

The invention can be more fully understood from the following detailed description thereof in connection with accompanying drawings described as follows.

FIG. 1b is a plot of baseline corrected optical density (OD) versus wavelength ($\lambda$) for the reflection hologram of FIG. 1a.

DETAILED DESCRIPTION OF THE INVENTION

The invention is a broad band reflection hologram and a dry process for forming the broad band reflection hologram from imaging of a photosensitive element containing a photopolymer photosensitive layer (e.g., a holographic recording film (HRF)).

The broad band reflection holograms of this invention are defined in terms of their reflection characteristics. Before describing the invention further, a definition of basic terms used in defining reflection characteristics is given below.

Definitions

The reflection characteristics of a reflection hologram are experimentally determined using a spectrophotometer to measure the amount of electromagnetic radiation transmitted through the hologram as a function of wavelength as outlined below:

$I_O$=Intensity of incident beam of electromagnetic radiation on the hologram.

$I_t$=Intensity of transmitted beam of electromagnetic radiation after passage through the hologram.

$I_r$=Intensity of reflected beam of electromagnetic radiation after being reflected from the surface where incident light impinges.

The spectrophotometer is used to determine $I_t$ for a known $I_O$ at each wavelength ($\lambda$) within the scanned range. The "transmittance", T', of the sample at a given wavelength is then determined using the following relationship:

$$T' = \text{transmittance} = I_t/I_o.$$

The "optical density" at a given wavelength is then determined from the transmittance according to the following relationship:

$$OD' = \text{optical density} = -\log_{10} T'.$$

A few cases will serve to illustrate the logarithmic relationship between OD' and T' (or OD and T as defined below). For the case where 100% of the incident electromagnetic radiation (light) is transmitted, then T'=1 and OD'=0. For the case where 10% of the light is transmitted, then T'=0.1 and OD'=1. For the case where 1% of the light is transmitted, then T'=0.01 and OD'=2. For the case where 0.1% of the light is transmitted, then T'=0.001 and OD'=3.

Figure 1A:
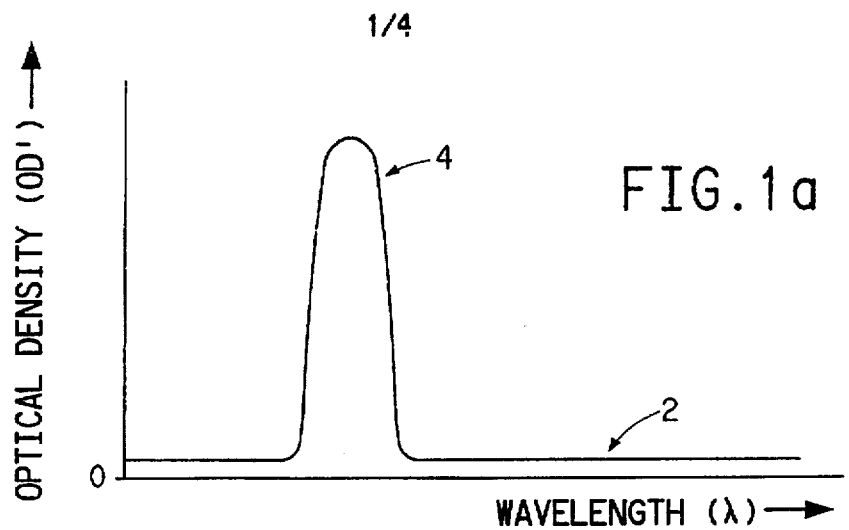
FIG. 1a is a plot of optical density (OD') versus wavelength ($\lambda$) for a typical reflection hologram in a photopolymer film.

A reflection hologram is usually characterized in terms of its "reflection efficiency," as is defined below. To determine reflection efficiency of a reflection hologram over a range of wavelengths of incident light, the transmittance is measured over this range and optical densities are calculated using the relationships above. This affords a plot of OD' versus wavelength. For a typical prior art photopolymer reflection hologram, the plot will typically look as shown in FIG. 1a. There will be a baseline 2 having low but non zero optical density on either side of a peak 4. This non zero baseline 2 is due to interfacial reflection at the glass/air interface as well as to residual absorption of light in the hologram sample. The baseline 2 is typically corrected to zero by drawing the best linear baseline and subtracting that difference in optical density in the calculations for reflection efficiencies (i.e., shifting the baseline to zero).

Figure 1B:
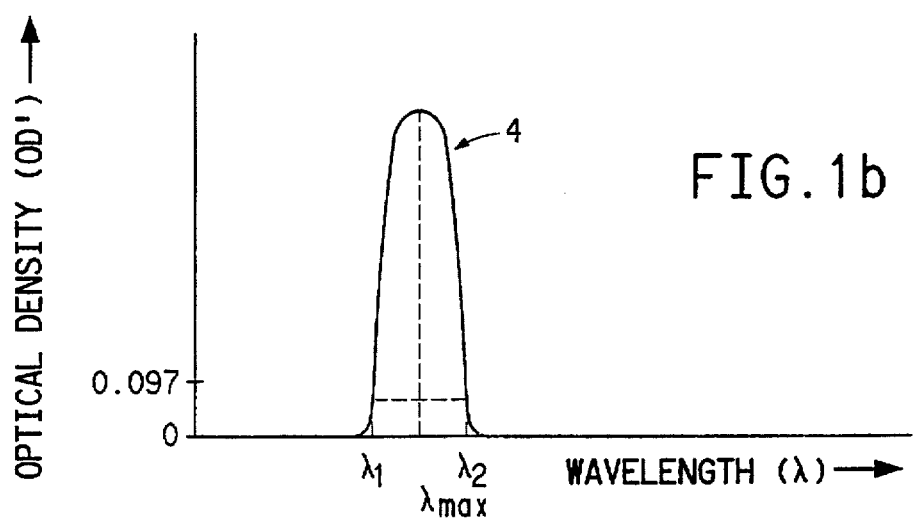

After the baseline has been shifted to zero, transmittance, T, and optical density, OD, are determined (i.e., T and OD are T' and OD', respectively, corrected for the baseline shift). FIG. 1b illustrates the baseline corrected plot of optical density OD versus wavelength $\lambda$. The reflection efficiency of the reflection hologram sample expressed as a percentage is then determined using the following relationship:

$$\begin{aligned} R &= \text{reflection efficiency} = (1 - T) \times 100 \\ &= (1 - 10^{-OD}) \times 100. \end{aligned}$$

Given the above relationship, the reflection efficiency of the hologram at a given wavelength will be 20% when the optical density (OD) is 0.097 or 50% when the optical density (OD) is 0.301.

A photopolymer reflection hologram can exhibit one or more points in the optical density versus wavelength plot where it has maximum optical density. Such a point, termed a "reflection maximum," corresponds to the wavelength(s) where the reflection efficiency or the optical density is a maximum. In FIG. 1b, this would be at wavelength $\lambda_{max}$. For a hologram which exhibits a symmetrical OD curve, such as is depicted in FIG. 1, $\lambda_{max}$ is equal to the "midpoint wavelength" (defined below).

The "bandwidth" or, more formally, "reflection bandwidth" (these two terms are synonymous when describing reflection holograms) is defined to be the difference between the maximum and minimum wavelengths where the hologram exhibits reflection efficiency of 20% (where OD=0.097). In FIG. 1, the reflection bandwidth of the hologram is $\lambda_2-\lambda_1$, where $\lambda_1$=minimum wavelength and $\lambda_2$=maximum wavelength where the hologram exhibits a reflection efficiency of 20%.

The "midpoint wavelength" is the average of $\lambda_1$ and $\lambda_2$.

Broad Band Reflection Hologram

Returning to the description of the invention, the present invention is an element comprising a photohardened photopolymer layer containing a broad band reflection hologram having a reflection bandwidth greater than 60 nm at 20% reflection efficiency and a diffusion element having a dry diffusion layer on the photopolymer layer.

Preferably, the bandwidth is greater than or equal to 75 nm and, more preferably, is greater than or equal to 100 nm. The reflection hologram can be formed to have virtually any midpoint wavelength. The reflection hologram can have a midpoint wavelength centered between about 330 nm and about 380 nm to reflect ultraviolet light, between about 380 nm and about 700 nm to reflect visible light, or between about 700 nm and about 1500 nm to reflect infrared light.

The following description of the process for making the broad band holograms of the present invention will reveal further details of the element of the present invention.

Process for Making Broad Band Reflection Hologram

In accordance with the present invention, the dry process for making a broad band reflection hologram in a photopolymer layer, the hologram having a final reflection bandwidth of at least 60 nm at 20% reflection efficiency, comprises:

imaging the photopolymer layer to form an imaged layer containing a reflection hologram having an initial reflection bandwidth less than the final bandwidth;

applying a diffusion layer to the imaged layer, the diffusion layer comprising a monomer selected from a group consisting of a polymerizable monomer that contains at least two methacrylate groups, pentaerythritol triacrylate, trimethylolpropane triacrylate, ethoxylated bisphenol A diacrylate, and hexamethylene diol diacrylate; and heating the imaged layer with the applied diffusion layer at 100° C. or more for at least 2 minutes to form the broad band reflection hologram having the final bandwidth.

Photosensitive Element

Figure 2:
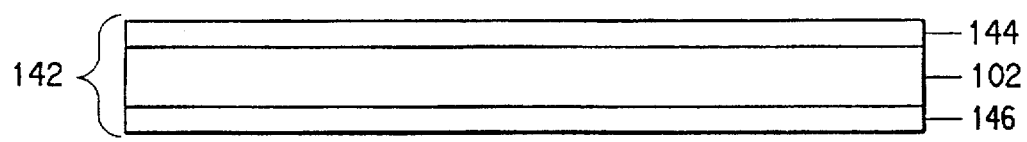
FIG. 2 illustrates a photosensitive element comprising a cover sheet, an unimaged photosensitive layer, and a support.

Referring to FIG. 2, the photopolymer or photosensitive layer 102 can be part of a photosensitive element 142. The photosensitive element 142 can comprise, in turn, an optional support 146, the photosensitive layer 102, and an optional cover sheet 44. Volume phase holograms are conveniently recorded in layers of photosensitive or holographic recording materials or media which produce a spatial pattern of varying refractive index, rather than absorption, when exposed to light. Holographic recording media are described in a number of references, such as, for example, L. Solymer and D. J. Cook, Volume Holography and Volume Gratings, Academic Press, New York, 1981, Chapter 10, pages 254–304.

Preferred recording media are photopolymerizable compositions. Photopolymerizable compositions useful for recording holograms are discussed in "Photopolymers for Holography and Waveguide Applications," by B. M. Monroe and W. K. Smothers, in Polymers for Lightwave and Integrated Optics: Technology and Applications, Part I: Foundations, L. A. Hornak, Ed., Marcel Dekker, New York, 1992, pages 145–170. Preferred photopolymerizable compositions are disclosed in Keys, U.S. Pat. No. 4,942,102; Monroe, U.S. Pat. No. 4,942,112; and Smothers, U.S. Pat. No. 4,959,284. Particularly preferred compositions are disclosed in Trout, U.S. Pat. No. 4,963,471. Preferred compositions include a monomer and a binder comprising one or more moieties selected from the group consisting of (1) aromatic moieties selected from the group consisting of (i) substituted or unsubstituted phenyl, (ii) substituted or unsubstituted naphthyl, and (iii) substituted or unsubstituted heterocyclic aromatic moieties having up to three rings; (2) chlorine; (3) bromine, and mixtures thereof; and a second one includes the monomer and the binder wherein the binder is substantially free of the moiety or moieties. Compositions in which the monomer contains the moiety are more preferred.

For systems in which the monomer contains the moiety and the binder is free of the moiety, preferred liquid monomers are: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, ethyl 1-benzoyl-2-vinyl-1-cyclopropane carboxylate and mixtures thereof. Preferred solid monomers, which may be used to advantage in combination with liquid monomers are: N-vinyl carbazole; 2,4,6-tribromophenyl acrylate or methacrylate; pentachlorophenyl acrylate or methacrylate; 2-naphthyl acrylate or methacrylate; 2-(2-naphthyloxy) ethyl acrylate or methacrylate; and mixtures thereof.

Preferred binders are poly (vinyl butyral) and poly (vinyl acetate). Particularly preferred are fluorine containing binders containing 3 to 35% by weight fluorine, especially copolymers of vinyl acetate, vinyl alcohol with tetrafluoroethylene, chlorotrifluroethylene and/or hexafluoropropylene, such the 82:18 (mole%) vinyl acetate/tetrafluoroethylene copolymer.

If crosslinking of the photopolymer is desired, up to about five weight percent of at least one multifunctional monomer containing two or more terminal ethylenically unsaturated groups may be incorporated into the composition. The multifunctional monomer must be compatible with the other components of the composition and is preferably a liquid. Suitable multifunctional monomers include di-(2-acryloxyethyl) ether of bisphenol A, ethoxylated bisphenol A diacrylate, and the like. A preferred crosslinking agent is ethoxylated bisphenol A diacrylate.

An initiator system comprises one or more compounds which directly furnish free-radicals when activated by actinic radiation. By "actinic radiation" is meant radiation which is active to produce the free-radicals necessary to initiate polymerization of the monomeric material. It can also comprise a plurality of compounds, one of which yields the free-radicals after having been caused to do so by another compound, or sensitizer, which is activated by the radiation. The photoinitiator system typically contains a photoinitiator and a sensitizer that extends the spectral response of the system to the wavelength of the actinic radiation, typically the visible or near infrared spectral region.

A large number of conventional initiator systems can be used. Photoreducible dyes and reducing agents; ketones; quinones; dye-borate complexes; and trichloromethyl triazines can be used to initiate photopolymerization. Useful discussions of initiator systems can be found in "Photopolymers: Radiation Curable Imaging Systems", by B. M. Monroe, in Radiation Curing: Science and Technology, S. P. Pappas, ed., Plenum, N.Y., 1992, pages 399–440 and "Free Radical Polymerization" by K. K. Dietliker, in Chemistry and Technology of UV and EB Formulation for Coatings, Inks, and Paints, P. K. T. Oldring, ed., SITA Technology, London, 1991, Vol. 3, pages 1–525.

Preferred initiator systems are 2,4,5-triphenyl-imidazolyl dimers. These compounds are disclosed in: Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. Preferred 2,4,5-triphenyl-imidazolyl dimers include CDM-HABI, i.e., 2-(o-chloro-phenyl)-4,5-bis(m-methoxyphenyl)-imidazole dimer; o-Cl-HABI, i.e., 1,1'biimidazole, 2,2'-bis (o-chlorophenyl)-4,4'5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

Preferred sensitizers include those disclosed in: Baum and Henry, U.S. Pat. No. 3,652,275; Dueber, U.S. Pat. No. 4,162,162; Smothers, U.S. Pat. No. 4,917,977; and Monroe, U.S. Pat. No. 4,987,230. Particularly preferred sensitizers include the following: DEAW, i.e., cyclo-pentanone, 2,5-bis [4-(diethylamino)phenyl]methylene-; JAW, i.e., cyclopentanone, 2,5-bis-[(2,3,6,7-tetrahydro-1H, 5H-b-enzo[i,j]-quinolizin-9-yl) methylene]-; cyclo-pentanone, 2,5-bis[2-(1, 3-dihydro-1,3,3-trimethyl-2H- indol-2-ylidene)ethylidene]; and cyclopentanone, 2,5-bis-[2-ethylnaphtho-[1,2-d]thiazol-2(1H)-ylidene)-ethylidene]. Suitable hydrogen donors include: 2-mercapto-benzoxazole, 2-mercapto-benzothiazole, 4-methyl-4H-1,2,4-triazole-3-thiol, and the like. Other suitable hydrogen donor compounds, that are preferred for compositions that contain N-vinyl carbazole, are 5-chloro-2-mercapto-benzo-thiazole; 2-mercaptobenzothiazole; 1H-1,2,4-tri-azole-3-thiol; 6- ethoxy-2-mercaptobenzothiazole; 4-methyl-4H-1,2,4-triazole-3-thiol; 1-dodecanethiol; and mixtures thereof.

Other components conventionally added to photopolymer compositions can be present to modify the physical properties of the recording medium, provided they are compatible with the composition and do not adversely affect the properties of the recording medium or the resulting hologram. Such components include: plasticizers, thermal stabilizers, optical brighteners, ultraviolet radiation absorbing material, adhesion modifiers, coating aids, and release agents.

The binder must be present in sufficient amount to form a film when the composition is coated. The photoinitiator system must be present in sufficient amount to initiate polymerization of the monomer on exposure to actinic radiation. The monomer must be present in sufficient amount to produce image differentiation, i.e., form a hologram, on polymerization. Proportions of ingredients in the photopolymerizable composition will generally be within the following percentage ranges, based on the total weight of the composition: binder, 25 to 90%, preferably 45 to 75%; monomer(s), 5 to 60%, preferably, 15 to 50%; plasticizer, 0 to 25%, preferably, 0 to 15%; photoinitiator system, 0.1 to 10%, preferably 1 to 7%; and optional ingredients, 0 to 5%, typically 0.1 to 4%.

The preferred recording media are substantially solid, i.e., dry films, and are normally used as a layer applied to a dimensionally stable support. The composition may be directly coated onto the support by any conventional method, or may be cast as a film and laminated to the support by conventional methods. In either case, the support provides dimensional stability for the holographic recording material. If the recording material is to be irradiated through the support, the support must be transparent to actinic radiation. Transparent supports that may be selected to advantage include: glass, polyethylene terephthalate, poly (methyl methacrylate), polyolefin, polycarbonate, and cellulose triacetate. A preferred support material is polyethylene terephthalate film.

The photosensitive element comprising the photosensitive layer and support can also comprise a temporary release film, or coversheet, on the other side of the supported photopolymerizable layer. The coversheet, can be, for example, polyethylene, polypropylene, polyethylene terephthalate, etc. Conventional intermediate layers or coatings may be used to facilitate the adhesive and/or release characteristics needed for the photopolymerizable layer.

Diffusion Element

Figure 3:
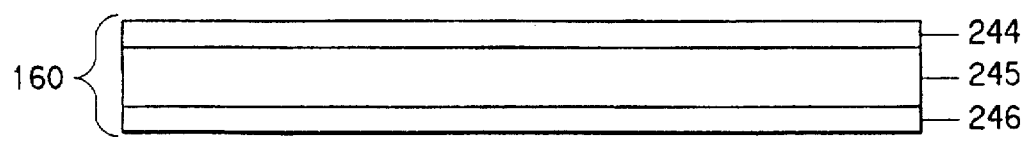
FIG. 3 illustrates a diffusion element comprising a cover sheet, a diffusion layer, and a support.

Referring to FIG. 3, the diffusion layer 245 can be part of a diffusion element 160. The diffusion element 160 can comprise, in turn, an optional support 246, the diffusion layer 245, and an optional cover sheet 244. The diffusion layer 245 is comprised of a binder and a monomer.

The binder is a polymer that can either be fluorinated or non-fluorinated. Suitable binders include, but are not limited to, poly(vinyl butyral), poly(vinyl acetate), poly(methyl methacrylate), tetrafluoroethylene/poly(vinyl acetate), tetrafluoroethylene/poly(vinyl acetate)/poly(vinyl alcohol), and tetrafluoroethylene/poly(vinyl acetate)/poly(vinyl alcohol)/chlorotrifluoroethylene.

The binder must be present in sufficient amount to form a film when the diffusion layer is coated.

The monomer is a diffusable monomer that is selected from the group consisting of a polymerizable monomer that contains at least two methacrylate groups, pentaerythritol triacrylate, trimethylolpropane triacrylate, ethoxylated bisphenol A diacrylate, and hexamethylene diol diacrylate. Suitable monomers include trimethylolpropane trimethacrylate, tetraethylene glycol dimethacrylate, triethylene glycol dimethacrylate, hexamethylene diol dimethacrylate, 1,14-tetradecanediol dimethacrylate, pentaerythritol triacrylate, trimethylolpropane triacrylate, ethoxylated bisphenol A diacrylate, and hexamethylene diol diacrylate. Preferred monomers contain at least two methacrylate groups.

Other components conventionally added to photopolymer compositions can be present in the diffusion layer to modify the physical properties of the diffusion layer, provided they are compatible with the composition and do not adversely affect the properties of the photosensitive element or the resulting hologram after having been subjected to the broad band process of this invention. Such additional components can include: a photoinitiator system, plasticizers, thermal stabilizers, optical brighteners, ultraviolet radiation absorbing material, adhesion modifiers, coating aids, and release agents.

One optional, but preferred, additional component of the diffusion layer is 1,4,4-trimethyl-2,3-diozabicyclo (3.2.2)-non-2-ene-2,3-dioxide, since, as is illustrated in the examples (especially Examples 46–48), the presence of this component in the diffusion layer affords a broad band hologram made according to this invention having a significantly greater bandwidth than does a broad band hologram made also according to this invention with an otherwise comparable diffusion layer without this component.

The preferred diffusion element is a substantially solid, i.e., dry film, and, while not required to be, it is normally used as a layer applied to a dimensionally stable support. The diffusion layer may be directly coated onto the support by any conventional method, or may be cast as a film and laminated to the support by conventional methods. In either case the support provides dimensional stability for the diffusion layer. If the diffusion element material is to be irradiated through the support, the support must be transparent to actinic radiation. Transparent supports that may be selected to advantage include: glass, polyethylene terephthalate, poly(methyl methacrylate), polyolefin, polycarbonate, and cellulose triacetate. A preferred support material is polyethylene terephthalate film.

The diffusion element may also comprise a temporary release film, or coversheet, on the other side of the supported diffusion layer. The coversheet, may be, for example, polyethylene, polypropylene, polyethylene terephthalate, etc. Conventional intermediate layers or coatings may be used to facilitate the adhesive and/or release characteristics needed for the diffusion layer.

The diffusion layer 245 of the diffusion element 160 can be 2 to 50 microns thick and preferably is 6–15 microns thick. The thickness of the optional cover sheet 244 and the optional support 246 are not critical and are not restricted in thickness.

Holographic Exposure

The photopolymer layer or recording medium 102 must be imaged to contain a reflection hologram. Although the coversheet 144 of the photosensitive element 142 can be removed prior to holographic exposure, such exposure is typically carried out with the coversheet 144 in place. Alternatively, the coversheet 144 can be removed and the holographic recording medium or photopolymer layer 102 can be laminated to a temporary substrate, such as a piece of glass or a front surface mirror, prior to holographic exposure or imaging.

For holographic exposure of the recording medium 102, coherent or substantially coherent light sources are required. Conventional sources of actinic radiation include fluorescent, mercury vapor, mercury-xenon, metal additive and arc lamps. Useful sources of coherent radiation are lasers whose emissions fall within or overlap the absorption bands of the photoinitiator system in the photopolymer photosensitive layer 102. To image photopolymerizable compositions sensitized across the visible spectrum, tunable lasers which match the broad spectral sensitivity of these compositions may be used. Techniques for carrying out holographic exposures are well known to those skilled in the art. A useful discussion of holography is presented in "Holography" by C. C. Guest in Encyclopedia of Physical Science and Technology, Vol. 6, pages 507–519, R. A. Meyers, Ed., Academic Press, Orlando, Fla. 1987.

Holograms are recorded by allowing two beams of coherent radiation, known as the object beam and the reference beam, to simultaneously enter the recording medium. The interference between these beams is recorded by the recording medium as a spatial pattern of varying refractive index.

Reflection holograms, i.e., holograms which are viewed in reflection, are formed by allowing the object beam and the reference beam to enter the recording medium from opposite sides so that they are traveling in approximately opposite directions. Reflection holograms may be produced by an on-axis method wherein the reference beam is projected through the recording medium onto an object there behind. The reflected beam becomes the object beam and interferes with the reference beam. Reflection holograms produced by an on-axis process are disclosed in an article by Yu N. Denisyuk entitled "Photographic Reconstruction of the Optical Properties of an object in its Own Scattered Radiation Field," publishing in Soviet Physics-Doklody, (ref-Col. 2, U.S. Pat. No. 4,995,785) 7, pages 543–5 (1962). Also see an article by Clark N. Kunyz entitled "Copying Reflection Holograms" published in the Journal of the Optical Society of America, 58, pages 856–7 (1968). Reflection holograms also may be produced by an off-axis method wherein a reference beam is projected on one side of the recording medium and an object beam is projected on the reverse side of the medium. Reflection holograms produced by an off-axis process are disclosed in Hartman, U.S. Pat. No. 3,532,406.

A holographic mirror is the simplest possible reflection hologram. It can be created by splitting a laser beam and recombining the beams at the recording medium (off-axis method). Alternatively, it can be created by projecting a laser beam through the recording medium onto a mirror (on-axis method). The light reflected by the mirror becomes the object beam, returning and interfering with the reference beam in the plane of the recording medium. In one process, the coversheet is removed and a reflective film such as aluminized polyethylene terephthalate, is laminated to the holographic recording material with the aluminized side in contact with the holographic recording material. Since the holographic recording material can adhere to the aluminized surface, this step is preferably carried out immediately prior to holographic exposure. Holographic exposure is then carried out through the support. The reflective film acts as a mirror during holographic exposure.

Figure 4:
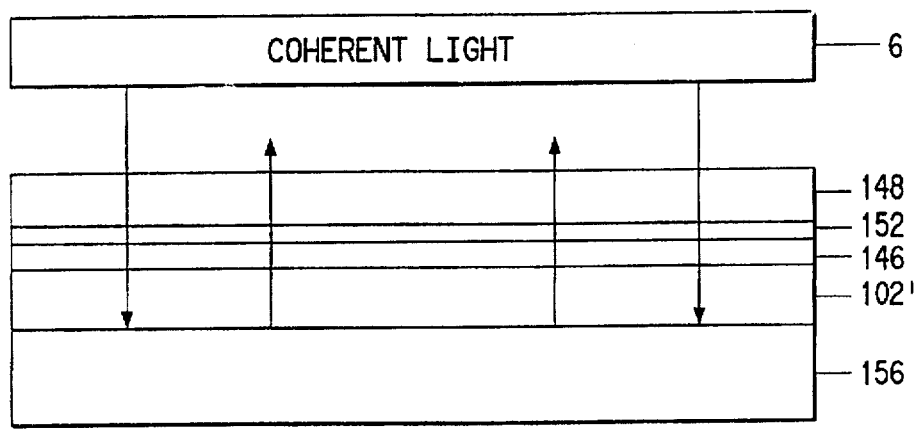
FIG. 4 illustrates one method of imaging a photosensitive layer of a photosensitive element to form a reflection hologram.

FIG. 4 illustrates one way for imaging the photopolymer layer 102 to form an imaged photopolymer layer 102' containing a reflection hologram having an initial reflection bandwidth. One starts with the photosenitive element 142 illustrated in FIG. 2. The coversheet 144 is removed. The resulting uncovered photosensitive layer 102 is disposed on a reflector 156. An optional anti-reflection plate 148 is then coupled through a first index matching fluid layer 152 to the dimensionally stable support 146. This results in a laminate structure which is depicted in FIG. 4. A source 6 of actinic radiation is selected that has been adapted to emit coherent or substantially coherent light. Light from the light source 6 is directed, in turn, through the anti-reflection plate 148, the photopolymer photosensitive layer 102 onto the reflector 156. The reflector 156 reflects the light back through the photopolymer photosensitive layer 102 such that the reflected light interferes with the light passing through the film layer 102 towards the reflector 156. This interference holographically images or imagewise holographically exposes and at least partially polymerizes or hardens the photopolymer photosensitive layer 102' to record a volume hologram in the form of a holographic mirror adapted to uniformly reflect light. This holographically imaged layer without further processing is referred to by the number 102' in the figures.

This holographic mirror is a volume phase reflection hologram. Preferably, as illustrated in FIG. 4, holographic imaging or imagewise holographic exposing is performed in a single step which occurs for about 20 seconds.

Hologram Processing

As disclosed in Keys, U.S. Pat. No. 4,942,102, following holographic exposure, the hologram may be optionally cured, exposed overall or flooded with actinic radiation to partially and/or substantially polymerize any monomer and fix the holographic mirror in the photohardened layer. In the case illustrated in FIG. 4, the anti-reflection plate 148 and the first index matching fluid layer 152 are removed before the resulting laminate is cured. Coherent radiation is not required for overall exposure. Exposure may be carried out with any convenient source of actinic radiation, such as a broad band ultraviolet light source, a graphics arc light source, laser, sunlight, etc. Throughout this application, the term "broad band ultraviolet light" means light in the spectral region of about 300 through 450 nanometers. This step provides an exposure level of about 100 millijoules per square centimeter ($mJ/cm^2$), but the exposure can be greater or less than this level. This step typically occurs for about one minute, but can occur longer. This step photohardens or substantially photohardens any remaining photosensitive material in the laminate structure. The refractive index modulation of the hologram can be enhanced by heating to 100–150° C. for about 0.5–1.5 hr following overall exposure. The overall reflection efficiency of the broad band hologram will be greater in photosensitive elements with higher refractive index modulation. Preferred photosensitive elements with fluorinated binders will give higher index modulation than photosensitive elements with non fluorinated binders, and therefore photosensitive elements with fluorinated binders will provide broad band holograms with greater reflection efficiencies.

Holograms with wider bandwidths made in accordance with this invention are typically produced if overall exposure is omitted. If patterned exposure is used instead of overall exposure, the resulting reflection hologram will have patterned areas of wider bandwidths and narrower bandwidths. The curing can be accomplished in a pattern-wise fashion such that first areas are cured and second areas are not cured or cured less than the first areas. This makes possible the creation of security devices.

The features demonstrated by Examples 15–17 can be taken advantage of further in security device applications. If the imaged photosensitive element, either a holographic mirror or holographic display image, were overall exposed pattern-wise to actinic radiation (e.g., UV light), such as through a photomask, first areas could be subjected to little or no UV light (like Example 15) and second areas could be exposed to relatively high levels of UV light (like Example 17). Subsequent processing with a diffusion element would yield broad band holograms throughout the entire area of the element. While the color and appearance of the first and second areas would differ little under white light, when viewed under blue or red light, the first areas will remain visible while the second areas will be dark. Thus, such special lighting would reconstruct the image of the photomask previously used to UV expose the imaged photosensitive element.

Using these principles, the broad band hologram can have at least a first area and at least a second area that reflect light in substantially the same manner when viewed under white light and that do not reflect light in the same manner when viewed under non white light. Further, a first image can be visible when the broad band hologram is viewed under light having a first bandwidth and a second image can be visible when the hologram is viewed under light having a second bandwidth. Furthermore, a broad band reflection hologram can be formed such that when it is sensed under light having a first bandwidth, a first image is detected; and when the broad band reflection hologram is sensed under light having a second bandwidth, a second image is detected which varies from the first image in shape, color, or other characteristic (e.g., shade, tone, etc.).

Such elements would have utility for security and product authentication devices where identifying images, while indistinguishable under white lights, can be revealed under special lighting either by eye or a machine-sensor. The use of such broad band holograms would be difficult if not impossible to copy, providing a significant barrier to a would-be counterfeiter.

Figure 5:
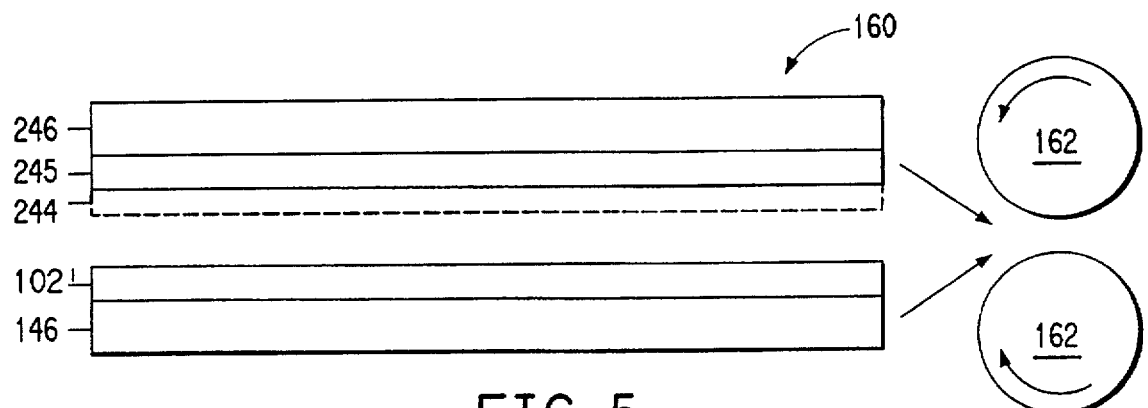
FIG. 5 illustrates laminating a diffusion layer of a diffusion element to the photosensitive layer to form a laminate.

Following optional overall exposure and optional thermal processing, the wavelength and bandwidth of the reflection hologram may be modified as described in Smothers, U.S. Pat. No. 4,959,293. Starting with the diffusing element depicted in FIG. 3, the cover sheet 244 is removed. Referring to FIG. 5, the diffusion layer 245 is applied or laminated to the surface of the imaged photopolymer layer 102".

Diffusion must be carried out at an elevated temperature. The degree of swelling of the hologram caused by diffusion can vary across the thickness of the hologram producing non uniform fringe spacing and an increased bandwidth of light reflected by the hologram. Preferably, pressure and heat is applied, such as, through a pair of heated rollers 162, thereby laminating the diffusion layer 246 to the imaged photopolymer layer 102" to ensure good contact between the layers 102" and 245.

The amount of diffusion can be controlled by variation of the amount of diffusion agent, e.g., monomer, in the diffusion element, the diffusibility of the diffusion agent (typically a function of its molecular weight), the diffusion time, and the temperature at which the diffusion is carried out. The hologram may be fixed by overall exposure following diffusion, either before or after removal of the diffusion element.

Surprisingly, it has been discovered that a broad band reflection hologram is produced in the photopolymer layer by (A) applying to the photopolymer photosensitive layer imaged to contain a reflection hologram a diffusion layer of a diffusion element, which diffusion layer comprises a binder and a polymerizable monomer selected from the group consisting of (1) a monomer that contains at least two methacrylate groups, (2) pentaerythritol triacrylate and (3) hexamethylene diol diacrylate, and (B) heating the resulting laminate to at least 100° C., preferably to 100°–170° C., for at least two minutes.

Figure 6:
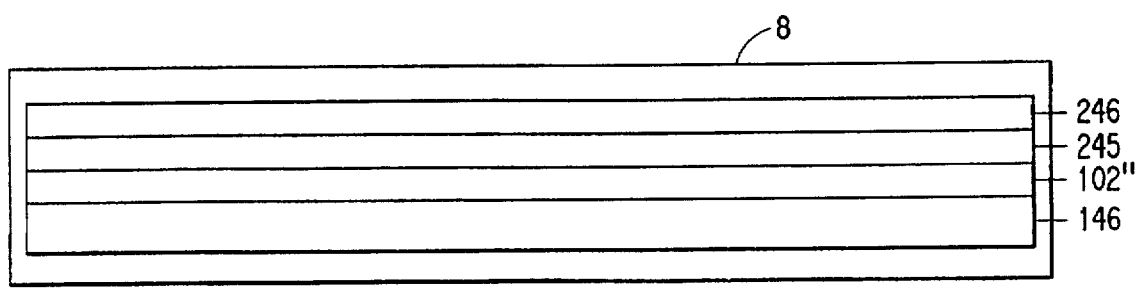
FIG. 6 illustrates heating a laminate in a static oven.
Figure 7:
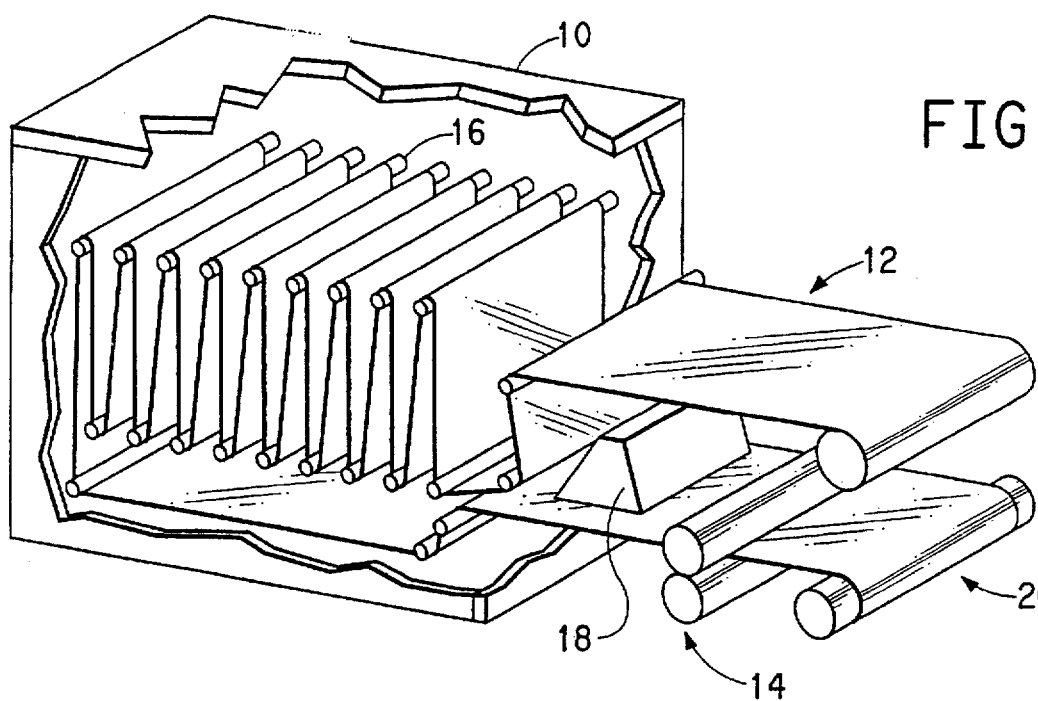
FIG. 7 illustrates heating the laminate as a moving web in a scroll oven.

This heat treatment of the laminate of the hologram and the diffusion layer after the diffusion step can be effected in any oven. The oven can be a conventional static oven, such as a forced air oven, where the hologram or laminate is not subjected to movement within the oven during the heating period. FIG. 6 is a schematic illustration of the laminate in a static oven 8. Alternatively, the oven can be a scroll oven, where the hologram or laminate is processed as a moving web of film(s) through the oven during the heating period. The description and use of a scroll oven for the continuous processing of holographic recording film (HRF) has been described in the following printed publication: Proc. SPIE, v 2176, "Practical Holography VIII, Materials and Processing", San Jose, Calif., February, 1994. In a scroll oven, heat processing of HRF (film) is done by heating a continuously moving web of the HRF (film) or laminate in a scroll format. FIG. 7 provides a schematic view of the moving web 12 of HRF film or laminate being processed using a scroll oven 10. Drive rolls 14 pull the moving web through a serpentine path around rollers 16 supported within the oven 10. After exiting the oven, a UV lamp 18 can flood expose the baked web before the web is wound on a wind-up roll 20.

The moving web method of heat treatment provided by the scroll oven offers the advantage of even heating throughout the roll. Image defects introduced by other methods of heating are eliminated in a moving web scroll oven. Furthermore, the moving web method provides for all film surfaces having the same uniform exposure to the atmospheric air, which is effective for broad band hologram formation.

In a conventional static oven, the heating is preferably at 120°–140° C. for 0.1–2.0 hours; in a scroll oven, the heating is preferably at 120°–145° C. for 0.1–0.5 hour.

Broad band hologram formation according to the process of the instant invention can be achieved in a scroll oven using a range of different temperatures and process times, as illustrated in the examples. Using a scroll oven with a film path length of 24 feet, broad band holograms can be obtained with scroll oven temperatures of about 100° C. to about 170° C. or even higher, and with process times of about 2 minutes to about 3 hours. In general, use of a higher scroll oven temperature provides for a lower process time in the scroll oven (i.e., higher line speed of the moving web).

Upon completion of the heating step, the diffusion element 160 can either be left in contact with, laminated to, or removed from the photohardened layer 102" containing the broad-banded hologram.

Figure 8:
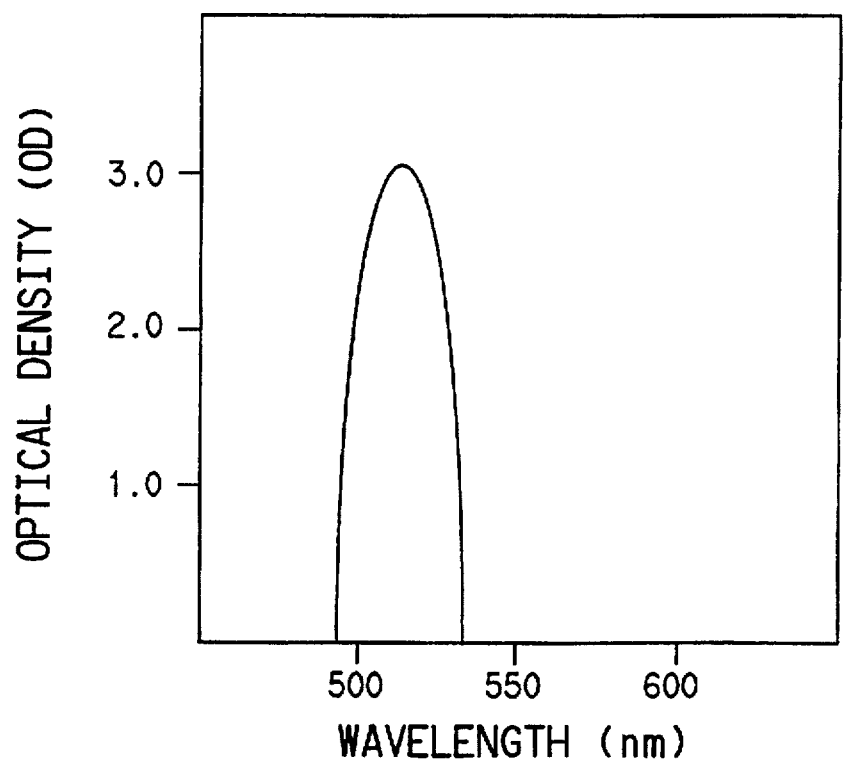
FIG. 8 is a graph illustrating optical density OD versus wavelength response of a reflection hologram before lamination in accordance with the present invention.
Figure 9:
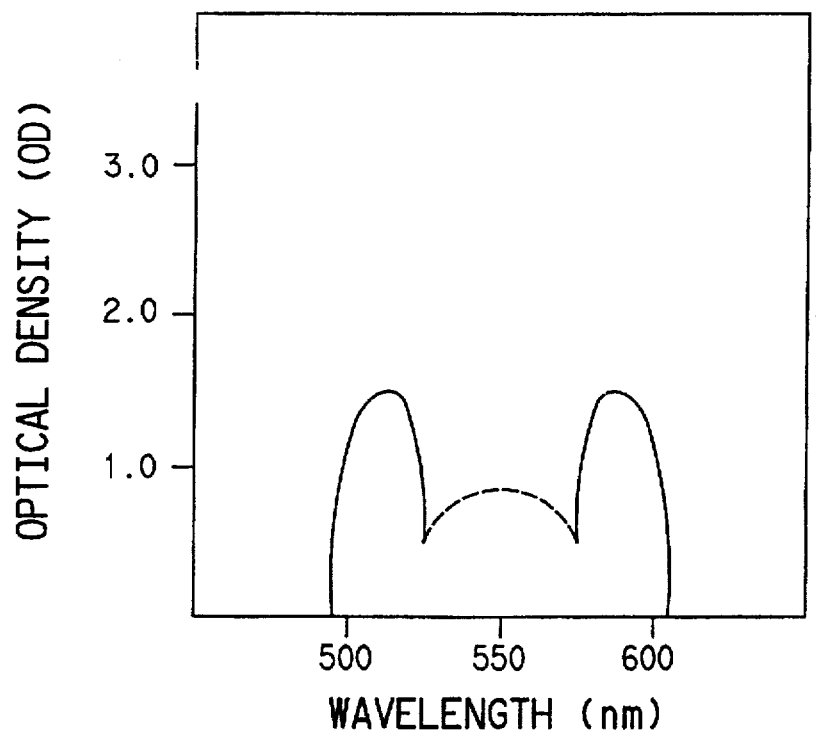
FIG. 9 is a graph illustrating optical density OD versus wavelength response of a reflection hologram after heating in accordance with the present invention.

FIG. 8 illustrates a typical optical density (OD) versus wavelength (λ) plot (corrected to have a zero baseline) for an imaged photopolymer photosensitive layer 102' comprising a reflection hologram prior to being subjected to the process of this invention for obtaining a broad band hologram. FIG. 9 illustrates a comparable plot after the imaged photopolymer layer 102" containing a reflection hologram has been subjected to the process of this invention to afford a broad band hologram.

Industrial Applicability

The process of this invention is particularly suited for the preparation of broad band reflection holograms. These holograms have bandwidths of at least about 60 nm at 20% reflection efficiency.

Holograms with their midpoint wavelength values centered in the visible region of the electromagnetic spectrum (380–700 nm) have been prepared. These holograms have bandwidths in the range from about 60 to about 170 nm. Such holograms are extraordinarily bright display or graphic art holograms.

Holograms with their midpoint wavelength values centered in the infrared region of the spectrum (700–900 nm) have been prepared. These holograms have bandwidths in the range of about 100–140 nm. Such holograms are capable of reflecting a broad band of infrared radiation and may be used as solar rejection filters. Further, any of these holograms can be used as reflectors, rejection filters, or concentrators. Furthermore, these broad band holograms can be used as white light filters reflecting or transmitting red, green, blue or other colors in liquid crystal displays (LCD) or projection television systems.

The advantageous properties of this invention can be observed by reference to the following examples which illustrate, but do not limit, the invention.

EXAMPLES

In the Examples which follow, "coating solution" refers to a mixture of solvents and additives coated on the support, even though some of the additives may be in suspension rather than in solution. "Total solids" refers to the total amount of nonvolatile material in a composition even though some of the additives may be nonvolatile liquids at ambient temperature.

In the Examples below, the analysis of holographic performance was done in the following manner. The transmission spectrum of each holographic mirror was recorded as optical density (OD') versus wavelength using a Perkin Elmer Lambda-9 spectrophotometer. Optical density (OD') was corrected for baseline providing OD. Reflection efficiencies (R) were calculated after baseline correction as $R=(1-10^{(-OD)})\times 100$. Performance of a given broad band reflection hologram is characterized by its bandwidth and brightness. Bandwidth (or, more formally, reflection bandwidth) is defined to be the difference between the maximum wavelength and minimum wavelength where the hologram exhibited reflection efficiency of 20% (where OD=0.097). Brightness is defined as the area under the reflection efficiency versus wavelength curve calculated numerically by Simpson's method).

| Glossary | |
|---|---|
| 4GB7 | Tetramethylene glycol diheptanoate |
| Brij ® 30 | Polyoxyethylene(4) lauryl ether; CAS 5274-68-0 |
| o-Cl-HABI | Biimidazole, 2,2'-bis[o-chlorophenyl]-4,4',5,5'-tetraphenyl-; CAS 1707-68-2 |
| Cyasorb ® UV-24 | 2,2'-Dihydroxy-4-methoxybenzophenone; CAS 131-53-3 |
| C14diolDA | 1,14-Tetradecanediol diacrylate |
| C14diolDMA | 1,14-Tetradecanediol dimethacrylate |
| CTFE | Chlorotrifluoroethylene |
| Elvacite ® 2051 | Poly(methyl methacrylate); MW 350,000; E. I. du Pont de Nemours and Company, Wilmington, DE |
| EBPADA | Ethoxylated bisphenol A diacrylate |
| EONPGDA | Ethoxylated neopentyl glycol diacrylate |
| FC-430 | Fluorad ® FC-430; fluoroaliphatic polymeric esters; CAS 11114-17-3; 3M Company, St. Paul, MN |
| HMDA | Hexamethylene diol diacrylate |
| HMDMA | Hexamethylene diol dimethacrylate |
| Irgacure ® 651 | α, α-Dimethoxy-α-phenylacetophenone |
| Isopar ® L | An aliphatic hydrocarbon product; Exxon Company, Houston, TX |
| JAW | Cyclopentanone, 2,5-bis[(2,3,6,7-tetrahydro-1H,5Hbenzo[i,j]quinolizin-9-yl)methylene]- |
| 2-MBO | 2-Mercaptobenzoxazole |
| MMT | 4-Methyl-4H-1,2,4-triazole-3-thiol; CAS 24854-43-1 |
| PEGDA | Polyethyleneglycol diacrylate |
| PETA | Pentaerythritol triacrylate |
| Photomer ® 4039 | Phenol ethoxylate monoacrylate; CAS 56641-05-5; Henkel, Ambler, PA |
| PNPGDA | Propolylated neopentyl glycol diacrylate |
| Sartomer ® 349 | Ethoxylated bisphenol A diacrylate; CAS 24447-78-7; Sartomer, West Chester, PA |
| TAOBN | 1,4,4-Trimethyl-2,3 diazobicyclo-(3.2.2)-non-2-ene-2,3-dioxide |
| TDMA | Triethylene glycol dimethacrylate |
| TEDMA | Tetraethylene glycol dimethacrylate |
| TEOTA | Triacrylate ester of ethoxylated trimethylolpropane |
| TFE | Tetrafluoroethylene |
| Tinopal ® SFG | 3-Phenyl-7-[2'-(4'-N,N-diethylamino)-6'-chloro-1',3',5'-triazinylamino]-coumarin; Ciba-Geigy, Hawthorne, NY |
| Tinopal ® PCR | 2-(Stilbyl)-(naphtho-1',2',4,5)-1,2,3-trizol-2"-sulfonic acid phenyl ester; CAS 6994-51-0; Ciba-Geigy, Ardsley, NY |
| TMPEOTA | Ethoxylated trimethylolpropane triacrylate |
| TMPTMA | Trimethylolpropane trimethacrylate |
| TMPTA | Trimethylolpropane triacrylate |
| TTEGEDA | Tetraethylene glycol diacrylate |
| VAc | Vinyl acetate |
| Vinac ® B-15 | Poly(vinyl acetate); MW 90,000; CAS 9003-20-7; Air Products and Chemicals, Allentown, PA |
| VOH | Vinyl alcohol |

Examples 1–4

These examples compare diffusion elements comprising varying amounts of trifunctional and monofunctional monomer.

Diffusion Elements: Coating solutions containing about 15% total solids were prepared by dissolving the ingredients listed in Table 1 in 15% methanol/85% dichloromethane. In Examples 1–4, the amounts of TMPTMA and Photomer® 4039 were varied. The binder was 22.5:77.5 wt % TFE:VAc, prepared as described in Trout, U.S. Pat. No. 4,963,471; inherent viscosity: 1.46 (0.2% in tetrahydrofuran). Solution preparation and all subsequent operations were carried out under yellow or red lights. Diffusion elements were prepared by coating the coating solutions onto an about 50 μm thick polyethylene terephthalate support using a Talboys coater fitted with an about 150 μm doctor knife and drier set at 50°–70° C. An about 23 μm thick polyethylene terephthalate coversheet was laminated to the coating as it emerged from the drier.

TABLE 1

| Example* | 1 | 2 | 3 | 4 |
|---|---|---|---|---|
| TFE/VAc Binder | 64.8 | 64.8 | 64.8 | 64.8 |
| TMPTMA | 24.0 | 20.0 | 16.0 | 12.0 |
| Photomer ® 4039 | 0.0 | 4.0 | 8.0 | 12.0 |
| Brij ® 30 | 8.0 | 8.0 | 8.0 | 8.0 |
| o-Cl HABI | 2.0 | 2.0 | 2.0 | 2.0 |

TABLE 1-continued

| Example[a] | 1 | 2 | 3 | 4 |
|---|---|---|---|---|
| MMT | 1.0 | 1.0 | 1.0 | 1.0 |
| TAOBN | 0.2 | 0.2 | 0.2 | 0.2 |
| Thickness (microns) | 6.6 | 6.7 | 9.5 | 7.6 |

[a]Percent by weight of total solids.

Holographic Photosensitive Element: A coating solution containing the following was made up in 75:25 2-butanone/toluene (All percentages are % by weight of total solids): 66.0% TFE/VAc; 17.0% Photomer® 4039; 3.0% Sartomer 349; 7.9% N-vinyl carbazole; 3.7% o-CL HABI; 2.1% MMT; 0.2% FC-430; and 0.1% JAW. The binder was 22:78 wt % TFE/VAc, inherent viscosity: 1.45 (0.2% in tetrahydrofuran).

The solution was filtered and coated onto an about 50 μm thick clear polyethylene terephthalate support using a Talboys coater. A coversheet of about 23 μm thick polyethylene terephthalate was laminated to the coating as it emerged from the drier to produce a photosensitive element consisting of coversheet, holographic recording material, and support. The holographic recording material was about 20 μm thick.

Holographic Exposure: Immediately prior to holographic exposure, the coversheet was removed from the holographic recording material. In its place, a 50 μm thick piece of aluminized polyethylene terephthalate was laminated to the holographic recording material with the aluminized side in contact with the holographic recording material. The holographic recording material was exposed through the support using the apparatus described in Armstrong, U.S. Pat. No. 4,995,685. Imaging was carried out at 514 nm (Argon ion laser) using an exposure of about 50 mJ/cm2. After the holographic exposure or imaging step formed the hologram in the layer, the layer was then overall exposed to about 100 mJ/cm of ultraviolet and visible light.

Hologram Processing: The coversheet was removed from the diffusion element and the aluminized polyethylene terephthalate removed from the exposed holographic recording material. The diffusion element and holographic recording material were laminated together, and the resulting laminate cut into four sections. The sections were placed in a 120° C. oven and one section of each laminate removed at 30, 60, 90 and 120 min. Heating was carried out in a static oven with good air circulation so that the laminate was heated rapidly to 120° C.

Hologram Evaluation: The transmission spectrum (380–780 nm) of each sample was measured on a Perkin Elmer model λ-9 spectrophotometer. The area under the reflection efficiency curve was calculated numerically (Simpson's method). The greater the area under the curve, the greater the reflection efficiency of the hologram. The bandwidth and midpoint wavelength of the reflection efficiency were determined at OD =0.097, 20% reflection efficiency. Results are shown in Table 2.

The main result obtained from this set of examples is that the Example 1 Samples, which had prior to processing the greatest amount of TMPTMA (a trimethacrylate monomer), exhibited the greatest reflection bandwidths. Furthermore, the reflection bandwidths decreased in going from Examples 1 to 2 to 3 to 4 as the amount of TMPTMA decreased. Further, Examples 1–4 show that the reflection bandwidth, or simply bandwidth, and midpoint wavelength of the resulting hologram can be changed and, in fact, controlled by varying the amount of monomer containing three methacrylate groups in the diffusion element and/or by varying the duration of the heating step.

TABLE 2

| Heating Time (min) | Area[a] (nm) | Minimum λ (nm) | Maximum λ (nm) | Midpoint λ (nm) | Bandwidth[b] (nm) |
|---|---|---|---|---|---|
| Example 1, Samples A–D | | | | | |
| A   30 | 33 | 566 | 621 | 593 | 55 |
| B   60 | 68 | 550 | 644 | 597 | 94 |
| C   90 | 68 | 534 | 647 | 590 | 113 |
| D   120 | 59 | 544 | 647 | 595 | 103 |
| Example 2, Samples A–D | | | | | |
| A   30 | 30 | 570 | 605 | 587 | 35 |
| B   60 | 52 | 543 | 632 | 587 | 89 |
| C   90 | 78 | 536 | 641 | 588 | 105 |
| D   120 | 73 | 550 | 648 | 599 | 98 |
| Example 3, Samples A–D | | | | | |
| A   30 | 30 | 564 | 621 | 592 | 57 |
| B   60 | 42 | 555 | 611 | 583 | 56 |
| C   90 | 55 | 552 | 620 | 586 | 68 |
| D   120 | 62 | 553 | 636 | 594 | 83 |
| Example 4, Samples A–D | | | | | |
| A   30 | 33 | 567 | 606 | 586 | 39 |
| B   60 | 44 | 556 | 610 | 583 | 54 |
| C   90 | 58 | 555 | 629 | 592 | 74 |
| D   120 | 56 | 553 | 622 | 587 | 69 |

[a]Integrated area under reflection efficiency curve.
[b]At 20% reflection efficiency.

Examples 5–7

These examples compare diffusion elements comprising varying amounts of trifunctional monomer.

The procedure of Examples 1–4 was repeated except that the diffusion elements had the compositions indicated in Table 3. Results are shown in Table 4.

TABLE 3

| Example: | 5 Wt %[a] | 6 Wt %[a] | 7 Wt %[a] |
|---|---|---|---|
| TFE/VAc Binder | 64.8 | 74.4 | 80.6 |
| TMPTMA | 24.0 | 13.4 | 8.1 |
| Brij ® 30 | 8.0 | 8.0 | 8.1 |
| o-Cl HABI | 2.0 | 2.0 | 2.0 |
| MMT | 1.0 | 1.0 | 1.0 |
| TAOBN | 0.2 | 0.2 | 0.2 |
| Thickness (microns) | 6.6 | 8.0 | 9.4 |

[a]Percent by weight of total solids.

TABLE 4

| Heating Time (min) | Area[a] (nm) | Minimum λ (nm) | Maximum λ (nm) | Midpoint λ (nm) | Bandwidth[b] (nm) |
|---|---|---|---|---|---|
| Example 5, Samples A–D | | | | | |
| A   30 | 33 | 566 | 621 | 593 | 55 |
| B   60 | 68 | 550 | 644 | 597 | 94 |
| C   90 | 68 | 534 | 647 | 590 | 113 |
| D   120 | 60 | 544 | 647 | 595 | 103 |
| Example 6, Samples A–D | | | | | |
| A   30 | 27 | 534 | 568 | 551 | 34 |
| B   60 | 52 | 518 | 585 | 551 | 67 |

TABLE 4-continued

| | Heating Time (min) | Area[a] (nm) | Minimum λ (nm) | Maximum λ (nm) | Midpoint λ (nm) | Bandwidth[b] (nm) |
|---|---|---|---|---|---|---|
| C | 90 | 63 | 513 | 587 | 550 | 74 |
| D | 120 | 63 | 517 | 588 | 552 | 71 |
| Example 7, Samples A-D | | | | | | |
| A | 30 | 35 | 528 | 566 | 547 | 38 |
| B | 60 | 39 | 527 | 570 | 548 | 43 |
| C | 90 | 49 | 516 | 572 | 544 | 56 |
| D | 120 | 48 | 519 | 576 | 547 | 57 |

[a]Integrated area under reflection efficiency curve.
[b]At 20% reflection efficiency.

The sample from Example 5, having the greatest amount of TMPTMA, exhibited the greatest bandwidth. Furthermore, the bandwidths were observed to decrease in going from Example 5 to Example 6 to Example 7, along with the midpoint wavelength, as the amount of TMPTMA is decreasing.

Example 8

This example illustrates that a diffusion element containing a monomer mixture of a triacrylate and a trimethacrylate affords a broad reflection bandwidth in a holographic film according to the instant invention.

A holographic recording material was made, holographically exposed and overall exposed in the same manner as in Examples 1–4.

Hologram Processing: The aluminized polyethylene terephthalate was removed from the exposed holographic recording material. An about 8 micron thick diffusion element on a 13μ polyethylene terephthalate support was laminated to it. The diffusion element had the following composition (% by weight): Elvacite® 2051, 32.4%; Vinac® B-15, 12.64%; TMPTMA, 35.55%; TEOTA, 7.90%; o-Cl HABI 1.58%; 2-mercaptobenzoxazole, 0.71%; Tinopal® PCR, 0.20% ; Tinopal® SFG, 0.99%; Cyasorb® UV-24, 0.08%; Brij® 30, 7.9%; hydroquinone, 0.05%; and TAOBN, 0.03%. The laminate of diffusion element and holographic recording material was heated in an oven at about 120° C. for about 2 hr. Heating was carried out in an oven with good air circulation so that the laminate was heated rapidly to 120° C.

The resulting holographic mirror had properties summarized in Table 5.

TABLE 5

| Example | Area[a] (nm) | Minimum λ (nm) | Maximum λ (nm) | Midpoint λ (nm) | Bandwidth[b] (nm) |
|---|---|---|---|---|---|
| 8 | 79 | 528 | 658 | 593 | 130 |

[a]Integrated area under reflection efficiency curve.
[b]At 20% reflection efficiency.

Example 9

This example illustrates the relative effectiveness of multifunctional methacrylate monomers, HMDA, and PETA in the diffusion element for affording the broad band effect.

Eighteen diffusion elements were prepared by the general method decribed in Example 1–4 utilizing 100% dichloromethane coating solvent, 14% total solids solution, and a 175 micron doctor knife. The diffusion elements had the following composition (% by weight): Elvacite® 2051, 32.8; Vinac® B-15, 12.8; o-Cl HABI, 1.6; 2-MBO, 0.72; Brij® 30, 8.0; hydroquinone, 0.05; TAOBN, 0.03; and the monomer as indicated in Table 6, 44.0. Each diffusion element was about 8 microns thick. Each diffusion element was coated onto about 50 micron thick polyethylene terephthalate, and covered with about 25 micron thick polyethylene.

Eighteen simple holographic mirrors were produced, each by the following method. A 40 micron thick layer of the holographic recording material described in Example 1 was stripped of its cover sheet and laminated to a flat transparent glass support. The glass support was optically coupled to a front surface mirror using Isopar® L as the index matching fluid. On the other side, an antireflection plate suitable for use with At+ 514 nm laser light was optically coupled to the polyethylene terephthalate on the holographic recording material using Isopar® L. The holographic recording material was then exposed to Ar+ 514nm laser light introduced normal to the face of the antireflection plate to a total exposure energy of about 34 mJ/cm2. The antireflection plate and front surface mirror were then removed, and the photopolymerizable composition on the glass support was given an overall UV exposure of about 150 mJ/cm2.

Each of the seventeen diffusion elements was processed with a simple holographic mirror by the following method. The polyethylene coversheet was removed from the diffusion element. A simple holographic mirror on its polyethylene terephthalate was removed from its glass support with the assistance of a razor blade. The diffusion element was then laminated to the simple holographic mirror at room temperature with a rubber roller. The diffusion element/ simple holographic mirror laminate was then heated in a forced air oven for about 2 hours at about 120° C.

One simple holographic mirror was left on its glass support and heated in a forced air oven for about 2 hours at about 120° C. as a Control.

The resultant holographic mirrors were evaluated by the method of Example 1–4. Results are summarized in Table 6.

TABLE 6

| Sample | Monomer | Area[a] (nm) | Minimum λ (nm) | Maximum λ (nm) | Midpoint λ (nm) | Bandwidth[b] (nm) |
|---|---|---|---|---|---|---|
| A | TEOTA | 32 | 513 | 552 | 532 | 39 |
| B | Control[c] | 32 | 486 | 524 | 505 | 38 |
| C | PEGDA | 36 | 524 | 563 | 543 | 39 |
| D | TTEGEDA | 37 | 520 | 561 | 40 | 41 |
| E | TMPEOTA | 42 | 520 | 569 | 544 | 49 |
| F | PNPGDA | 47 | 536 | 589 | 562 | 53 |
| G | C14diolDA | 38 | 484 | 541 | 512 | 57 |
| H | EONPGDA | 48 | 526 | 584 | 555 | 58 |
| I | TMPTA | 50 | 525 | 585 | 555 | 60 |
| J | TEDMA* | 56 | 510 | 576 | 543 | 66 |
| K | TMPTMA* | 57 | 497 | 566 | 531 | 69 |
| L | HMDA | 51 | 488 | 566 | 527 | 78 |
| M | PETA | 68 | 515 | 590 | 552 | 75 |
| N | EBPADA | 48 | 483 | 569 | 526 | 79 |
| O | TDMA* | 64 | 498 | 581 | 539 | 83 |
| P | Control[d] | 75 | 505 | 596 | 550 | 91 |
| Q | HMDMA* | 75 | 495 | 589 | 542 | 94 |
| R | C14DiolDMA* | 90 | 507 | 626 | 566 | 119 |

[a]Integrated area under reflection efficiency curve.
[b]At 20% reflection efficiency.
[c]No diffusion element used.
[d]Diffusion element from Example 8 used.

TABLE 6-continued

| Sample | Monomer | Area[a] (nm) | Minimum λ (nm) | Maximum λ (nm) | Midpoint λ (nm) | Bandwidth[b] (nm) |
|---|---|---|---|---|---|---|

[a] Multifuntional methacrylate monomer, i.e., contains two or more methacrylate groups.

Therefore, Example 9 shows that reflection holograms with bandwidths greater than about 60 nm are formed when the monomer in the diffusion element is selected from the group consisting of a polymerizable monomer that contains at least two methacrylate groups, pentaerythritol triacrylate, trimethylolpropane triacrylate, ethoxylated bisphenol A diacrylate, and hexamethylene diol diacrylate.

Example 10

This example illustrates the effect of varying the thickness of the holographic photosensitive layer or recording material (HRF) on the resulting broadband holographic mirror.

Simple holographic mirrors were prepared as described in Example 9 in holographic recording material of thickness 10, 20 and 40 microns. Two simple holographic mirrors were prepared for each thickness.

As controls, one simple holographic mirror of each thickness was left on its glass support and heated in a forced air oven at about 120° C. for about 2 hours. To the diffusion element of Example 8 was laminated one simple holographic mirror of each thickness. Each diffusion element/simple holographic mirror laminate was heated in a forced air oven at about 120° C. for about 2 hours.

The resultant holographic mirrors were evaluated by the method of Example 1–4. Results are summarized in Table 7.

TABLE 7

| HRF Thickness (microns) | Area[a] (nm) | Minimum λ (nm) | Maximum λ (nm) | Midpoint λ (nm) | Bandwidth[b] (nm) |
|---|---|---|---|---|---|
| Without Diffusion Element, Samples A–C | | | | | |
| A  10 | 25 | 490 | 520 | 505 | 30 |
| B  20 | 31 | 485 | 521 | 503 | 36 |
| C  40 | 31 | 489 | 527 | 508 | 38 |
| With Diffusion Element, Samples D–F | | | | | |
| D  10 | 27 | 600 | 635 | 617 | 35 |
| E  20 | 72 | 539 | 641 | 590 | 102 |
| F  40 | 78 | 508 | 606 | 557 | 98 |

[a] Integrated area under reflection efficiency curve.
[b] At 20% reflection efficiency.

Example 10 shows that the bandwidth and midpoint wavelength of the resulting reflection hologram can be changed and controlled by increasing the thickness of the holographic recording material (photosensitive layer). More specifically, Example 10 shows that for materials used the resulting reflection hologram has a bandwidth greater than or equal to about 60 nm when the minimal thickness of the photosensitive layer is somewhere between 10 and 20 microns.

Example 11

This example illustrates the formation of broadband holographic mirrors that reflect infrared light.

Two simple holographic mirrors were produced, each by the following method. A 40 micron thick layer of the photopolymerizable composition described in Example 1 was stripped of its cover sheet and laminated to a flat transparent glass support. The glass support was optically coupled to a front surface mirror using Isopar® L as the index matching fluid. On the other side, a 45° glass prism was optically coupled to the polyethylene terephthalate support on the photopolymerizable composition using Isopar® L. The photopolymerizable composition was then exposed to Ar+ 514 nm laser light introduced normal to the face of the 45° prism to a total exposure energy of about 100 mJ/cm2. The prism and front surface mirror were then removed, and the photopolymerizable composition on the glass support was given an overall UV exposure of about 150 mJ/cm2.

One simple holographic mirror was heated on its glass support in a forced air oven for about 2 hours at about 120° C. The second simple holographic mirror was stripped from its glass support, laminated to the diffusion element of Example 8 and heated in a forced air oven for about 2 hours at about 120° C. The resultant mirrors were analyzed as in Example 1. Results are given in Table 8.

TABLE 8

| Diffusion Element Thickness (microns) | Area[a] (nm) | Minimum λ (nm) | Maximum λ (nm) | Midpoint λ (nm) | Bandwidth[b] (nm) |
|---|---|---|---|---|---|
| Without Diffusion Element, Sample A | | | | | |
| A  — | 45 | 682 | 735 | 708 | 53 |
| With Diffusion Element, Sample B | | | | | |
| B  8 | 86 | 716 | 833 | 774 | 117 |

[a] Integrated area under reflection efficiency curve.
[b] At 20% reflection efficiency.

This example shows the formation of a photopolymer broad band reflection hologram which reflects light in the infrared region of the electromagnetic spectrum and is therefore useful as a solar rejection filter.

Example 12

Broad band holograms that reflect in the infrared were prepared as described in Example 11, with the exception that diffusion layers of three different thicknesses were used. Each diffusion element had the same composition as the diffusion element of Example 8. Results are given in Table 9.

TABLE 9

| Diffusion Element Thickness (microns) | Area[a] (nm) | Minimum λ (nm) | Maximum λ (nm) | Midpoint λ (nm) | Bandwidth[b] (nm) |
|---|---|---|---|---|---|
| With Diffusion Element, Samples A–C | | | | | |
| A  8 | 86 | 716 | 833 | 774 | 117 |
| B  12 | 85 | 722 | 870 | 796 | 148 |
| C  25 | 62 | 742 | 887 | 814 | 145 |

[a] Integrated area under reflection efficiency curve.
[b] At 20% reflection efficiency.

Example 12 shows that the bandwidth and midpoint wavelength (band Center wavelength) of the resulting reflection hologram can be changed, controlled, and increased by increasing the thickness of the diffusion layer. More specifically, Example 12 shows that the resulting reflection hologram has a bandwidth greater than or equal to about 145 nm when the diffusion layer is at least 12 microns thick.

Example 13

This example illustrates that the presence of a photoinitiator system in the diffusion layer is not required in order for the broad band effect to occur using the process of the instant invention.

Four diffusion elements were prepared by the general method described in Example 1–4 utilizing 100% dichloromethane coating solvent, about 17.5% total solids and about 125 micron doctor knife, to a diffusion element diffusion element thickness of 8.5+/−0.5 microns according to the formulations given below in Table 10.

TABLE 10

| | Amount (weight %) | | | |
|---|---|---|---|---|
| Component | Film A | Film B | Film C | Film D |
| Elvacite ® 2051 | 35.12 | 32.8 | 32.8 | 32.8 |
| Vinac ® B-15 | 12.8 | 12.8 | 12.8 | 12.8 |
| TMPTMA | 36.0 | 36.0 | 36.0 | 36.0 |
| TEOTA[a] | 8.0 | 8.0 | 8.0 | 8.0 |
| Brij ® | 308.0 | 8.0 | 8.0 | 8.0 |
| TAOBN | 0.03 | 0.03 | 0.03 | 0.03 |
| Hydroquinone | 0.05 | 0.05 | 0.05 | 0.05 |
| o-Cl-HABI | | 1.60 | | |
| 2-MBO | | 0.72 | | |
| Irgacure ® 651 | | | 2.32 | |
| ITX | | | | 0.58 |
| EPD | | | | 1.74 |

[a]Molecular weight = 1000.

The absence of a photoinitiator in the film A composition was made up by adding additional binder Elvacite® 2051.

Simple holographic mirrors were prepared as described in Example 9. Each of the diffusion films above was laminated to the simple mirrors and heated as described in Example 9. The resulting broad band holographic mirrors were then evaluated by the method of Example 1–4, which afforded the results summarized below in Table 11.

TABLE 11

| Film | Area[a] (nm) | Minimum λ (nm) | Maximum λ (nm) | Midpoint λ (nm) | Bandwidth[b] (nm) |
|---|---|---|---|---|---|
| #1 | 84 | 512 | 616 | 564 | 104 |
| #2 | 74 | 508 | 602 | 555 | 94 |
| #3 | 84 | 498 | 607 | 552 | 109 |
| #4 | 78 | 511 | 606 | 558 | 95 |

[a]Integrated area under reflection efficiency curve.
[b]At 20% reflection efficiency.

As the results above show, this example demonstrates that it is not necessary to have a photoinitiator in the diffusion element in order to produce a broad band holographic mirror.

Example 14

This example illustrates that the presence of a plasticizer in the diffusion layer of the diffusion element is not required in order for the broad band effect to occur using the process of the instant invention. Specifically, these examples show the effect of plasticizers (Brij 30 and 4G7) on broad band behavior.

The procedure of Examples 1–4 was repeated except that the diffusion elements had compositions indicated in Table 12.

TABLE 12

| Component | Film 14-A[a] Wt(g) | Wt % | Film 14-B[a] Wt(g) | Wt % | Film 14-C[a] Wt(g) | Wt % |
|---|---|---|---|---|---|---|
| TFE/VAc[b] | 9.72 | (64.8) | 9.72 | (64.8) | 9.72 | (64.8) |
| Brij ® 30 | 0.00 | (0.0) | 1.20 | (8.0) | 0.00 | (0.0) |
| 4G7 | 0.00 | (0.0) | 0.00 | (0.0) | 1.20 | (8.0) |
| TMPTMA | 4.80 | (32.0) | 3.60 | (24.0) | 3.60 | (24.0) |
| MMT | 0.15 | (1.0) | 0.15 | (1.0) | 0.15 | (1.0) |
| o-Cl HABI | 0.30 | (2.0) | 0.30 | (2.0) | 0.30 | (2.0) |
| TAOBN | 0.03 | (0.2) | 0.03 | (0.2) | 0.03 | (0.2) |

[a]Film Thickness 9.4 microns(14a); 11.2 microns 14b); 17.4 microns (14c).
[b]TFE/VAc binder, 22.7 wt % TFE, inherent viscosity = 1.44.

Table 13 summarizes the results when the diffusion elements were processed with the photosensitive element used in Examples 1–4.

TABLE 13

| Sample | Heating Time (min) | Area[a] (nm) | Minimum λ (nm) | Maximum λ (nm) | Midpoint λ (nm) | Bandwidth[b] (nm) |
|---|---|---|---|---|---|---|
| Film 14-A | | | | | | |
| 14-A-1 | 30 | 64 | 544 | 636 | 590 | 92 |
| 14-A-2 | 60 | 52 | 522 | 653 | 587 | 131 |
| 14-A-3 | 90 | 81 | 515 | 646 | 580 | 131 |
| 14-A-4 | 120 | 93 | 513 | 657 | 585 | 144 |
| Film 14-B | | | | | | |
| 14-B-1 | 30 | 64 | 547 | 633 | 590 | 86 |
| 14-B-2 | 60 | 79 | 524 | 630 | 577 | 106 |
| 14-B-3 | 90 | 76 | 525 | 636 | 580 | 111 |
| 14-B-4 | 120 | 92 | 525 | 649 | 587 | 124 |
| Film 14-C | | | | | | |
| 14-C-1 | 30 | 31 | 572 | 611 | 591 | 39 |
| 14-C-2 | 60 | 73 | 552 | 648 | 600 | 96 |
| 14-C-3 | 90 | 75 | 548 | 651 | 599 | 103 |
| 14-C-4 | 120 | 81 | 547 | 664 | 605 | 117 |

[a]Integrated area under reflection efficiency curve.
[b]At 20% reflection efficiency.

As the above data indicates, the presence of a plasticizer in the diffusion element is not necessary in order to achieve a broad band hologram according to the instant invention. In fact, the diffusion layer (film 14-A) without plasticizer was observed to afford the broadest bandwidth in the imaged HRF of the three diffusion layers tested in accordance with the teachings of the instant invention.

Examples 15–17

These examples demonstrate the effect of UV exposure (i.e., curing) of the imaged photosensitive element (before lamination to diffusion element and heating) on the final bandwidth of the broad band hologram.

The photosensitive element used was that of Examples 1–4, and was similarly imaged using the apparatus described in Armstrong, U.S. Pat. No. 4,995,685. The imaged photosensitive elements were UV exposed in-line (at 4 ft/min) using either 1, 4 or 8 UV lamps providing either 11, 45 or 90 mJ/cm$^2$ respectively. The imaged photosensitive elements were then laminated to the diffusion element of Example 9, and were heated at 120° C. for 2 hrs. Holographic performances are summarized in Table 14.

TABLE 14

| Example | UV Cure (mJ/cm²) | Area[a] (nm) | Minimum λ (nm) | Maximum λ (nm) | Midpoint λ (nm) | Bandwidth[b] (nm) |
|---|---|---|---|---|---|---|
| 15 | 11 | 77 | 516 | 676 | 596 | 160 |
| 16 | 45 | 79 | 527 | 668 | 597 | 141 |
| 17 | 90 | 69 | 541 | 632 | 586 | 91 |

[a]Integrated area under reflection efficiency curve.
[b]At 20% reflection efficiency.

Figure 10:
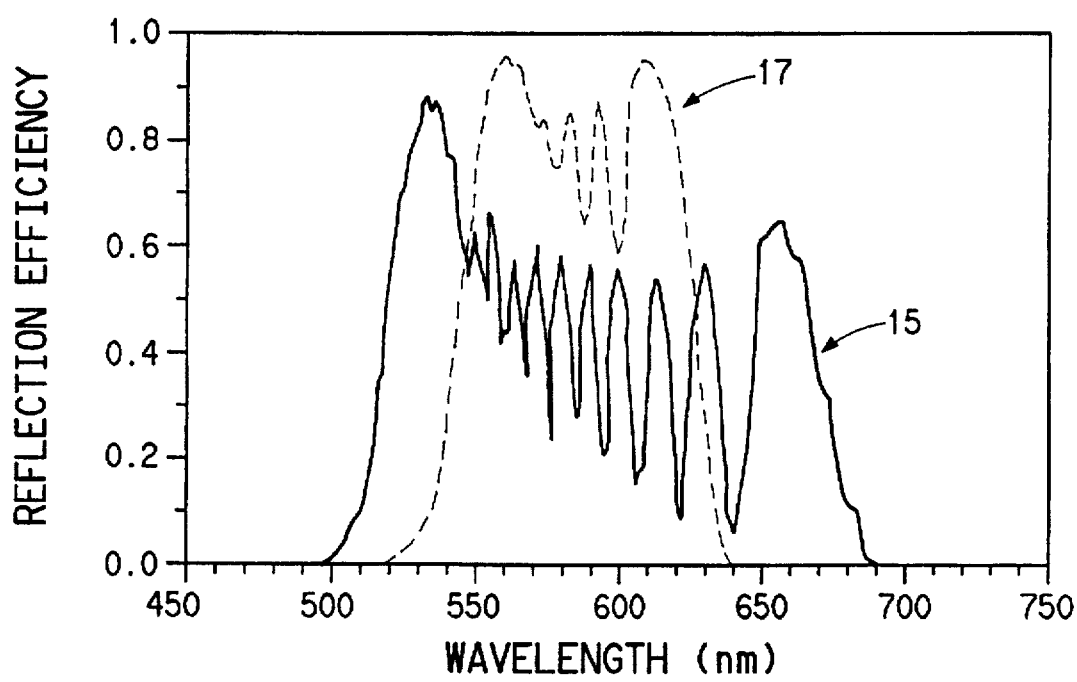
FIG. 10 is a plot of reflection efficiency versus wavelength for each of two different broad band holograms having different reflection properties.

The baseline corrected reflection efficiency curves 15 and 17 for Examples 15 and 17, respectively, are shown in FIG. 10. Note that while the midpoint wavelengths of each spectrum are nearly the same, the hologram of Example 15 exhibited wider bandwidth than that for Example 17. Thus, the Example 15 hologram can reflect appreciable light below 525 nm (blue-green) and above 640 nm (red), while the Example 17, hologram does not.

The color of that portion of white light (e.g. CIE Illuminant C) reflected from the holograms of examples 15 through 17 do not differ greatly as measured by the chromaticity coorinates (x,y,z) calculated from the reflection efficiency curves using the method in ASTM E308-85 for the CIE 1931 Standard (2°) Observer. These color coodinates are given in Table 15.

TABLE 15

| Example | x | y | z |
|---|---|---|---|
| 15 | 0.423 | 0.564 | 0.013 |
| 16 | 0.470 | 0.525 | 0.005 |
| 17 | 0.513 | 0.485 | 0.002 |

Although visual differences in appearance (by eye) of Examples 15 through 17 under white light will be small, the situation changes drastically when viewed under blue-green light (<525 nm) or red light (>640 nm). In these cases, the Example 15 hologram will reflect light and will be viewable, while the Example 17 hologram will reflect little light and will appear dark.

Examples 18–19

These examples compare diffusion elements with different binders, TFE/VAc vs. TFE/VAc/VOH.

The diffusion elements were prepared in similar fashion to those of Examples 1 through 4. Each had (all percentages are % by weight of total solids) 64.8% binder, 24% TMPTMA, 8% Brij® 30, 2% o-Cl HABI, 1% MMT, 0.2% TAOBN. Example 18 had TFE/VAc binder (22.1 wt % TFE, inherent viscosity=1.41) and was 16 microns thick. Example 19 had TFE/VAc/VOH binder (23.3 wt % TFE, 7.5 wt % VOH, inherent viscosity=1.43) and was 17 microns thick.

Examples 18 and 19 were laminated to the imaged photosensitive element of Examples 1 through 4 and heated at 120° C. The holographic results are summarized in Table 16. Note, similar broadband behavior was observed regardless of binder used in diffusion element.

TABLE 16

| Sample | Heating Time (min) | Area[a] (nm) | Minimum λ (nm) | Maximum λ (nm) | Midpoint λ (nm) | Bandwidth[b] (nm) |
|---|---|---|---|---|---|---|
| Example 18 | | | | | | |
| A | 30 | 36 | 571 | 615 | 593 | 44 |
| B | 60 | 82 | 539 | 654 | 596 | 115 |
| C | 90 | 87 | 534 | 660 | 597 | 126 |
| D | 120 | 87 | 539 | 666 | 602 | 127 |
| Example 19 | | | | | | |
| A | 30 | 38 | 599 | 644 | 621 | 45 |
| B | 60 | 58 | 573 | 642 | 607 | 69 |
| C | 90 | 94 | 540 | 666 | 603 | 126 |
| D | 120 | 97 | 531 | 664 | 597 | 133 |

[a]Integrated area under reflection efficiency curve.
[b]At 20% reflection efficiency.

These examples illustrate that the choice of binder for the diffusion element in this invention is not critical.

Examples 20–45

These examples demonstrate the effect of binder type used in the photosensitive element on broad band behavior.

Photosensitive elements were prepared in similar fashion as the diffusion elements in Examples 1–4, however, all operations were done under red lights and a 254 μm doctor knife was used. Each had (all percentages are % by weight of total solids) 66.2% binder, 26.3% Photomer® 4039, 3.0% Sartomer 349, 3.0% o-Cl HABI, 1.5% MMT, 0.045% JAW. Binder compositions and properties along with film thicknesses are given in Table 17

Holographic mirrors were recorded in the photosensitive elements using a process similar to that used in Example 9. The imaged photosensitive element was laminated to the diffusion element of Example 8 and heated for 2 hr. at 120° C. The holographic results are summarized in Table 18.

Photosensitive elements with each binder type, except Examples 23, 31, 37 and 42, exhibited broadband behavior in accordance with this invention.

TABLE 17

| | Binder Composition and Properties | | | | | | Film |
|---|---|---|---|---|---|---|---|
| Example | Wt % TFE | Wt % CTFE | Wt % VAc | Wt % VOH | Wt % VOS | Inherent Viscosity | Thickness (microns) |
| 20 | 21.6 | 0 | 78.4 | 0 | 0 | 1.41 | 17.2 |
| 21 | 22.3 | 0 | 74.7 | 3.1 | 0 | 1.42 | 18.3 |
| 22 | 22.6 | 0 | 73.0 | 4.5 | 0 | 1.42 | 19.7 |
| 23 | 22.9 | 0 | 71.3 | 5.9 | 0 | 1.43 | 20.0 |
| 24 | 23.3 | 0 | 68.5 | 8.2 | 0 | 1.43 | 21.2 |
| 25 | 23.4 | 0 | 76.6 | 0 | 0 | 0.55 | 19.3 |
| 26 | 22.0 | 0 | 78.0 | 0 | 0 | 0.95 | 18.9 |
| 27 | 23.3 | 0 | 76.7 | 0 | 0 | 1.13 | 18.7 |
| 28 | 22.5 | 0 | 77.5 | 0 | 0 | 1.37 | 18.7 |
| 29 | 23.5 | 0 | 76.5 | 0 | 0 | 1.51 | 19.6 |
| 30 | 22.0 | 0 | 78.0 | 0 | 0 | 1.69 | 22.4 |
| 31 | 20.5 | 17.0 | 62.5 | 0 | 0 | 1.32 | 17.0 |
| 32 | 20.8 | 17.3 | 60.5 | 1.4 | 0 | 1.34 | 19.9 |
| 33 | 21.0 | 17.5 | 58.8 | 2.7 | 0 | 1.39 | 18.5 |
| 34 | 21.0 | 18.7 | 56.3 | 4.0 | 0 | 1.33 | 18.8 |
| 35 | 21.4 | 17.8 | 56.1 | 4.7 | 0 | 1.37 | 18.4 |
| 36 | 21.7 | 18.1 | 54.0 | 6.2 | 0 | 1.39 | 17.1 |
| 37[*] | 0 | 0 | 100 | 0 | 0 | 1.30 | 19.8 |
| 38 | 10.3 | 0 | 89.7 | 0 | 0 | 1.17 | 19.3 |
| 39 | 14.3 | 0 | 85.7 | 0 | 0 | 1.25 | 19.7 |
| 40 | 21.8 | 0 | 78.2 | 0 | 0 | 1.22 | 19.3 |

TABLE 17-continued

| | Binder Composition and Properties | | | | | | Film |
|---|---|---|---|---|---|---|---|
| Example | Wt % TFE | Wt % CTFE | Wt % VAc | Wt % VOH | Wt % VOS | Inherent Viscosity | Thickness (microns) |
| 41 | 23.9 | 0 | 76.1 | 0 | 0 | 1.27 | 19.8 |
| 42 | 24.2 | 0 | 68.1 | 7.7 | 0 | 1.45 | 14.6 |
| 43 | 23.7 | 0 | 66.7 | 6.3 | 3.4 | 1.42 | 15.1 |
| 49 | 23.3 | 0 | 65.6 | 5.1 | 6.1 | 1.40 | 14.4 |
| 45 | 22.5 | 0 | 63.3 | 2.9 | 11.4 | 1.34 | 10.8 |

[a]Vinac ® B-100 used

TABLE 18

| Example | Area[a] (nm) | Minimum λ (nm) | Maximum λ (nm) | Midpoint λ (nm) | Bandwidth[b] (nm) |
|---|---|---|---|---|---|
| 20 | 56 | 537 | 640 | 588 | 116 |
| 21 | 56 | 531 | 556 | 543 | 158 |
| 22 | 45 | 531 | 545 | 538 | 162 |
| 23 | 47 | 535 | 553 | 544 | 54 |
| 24 | 42 | 536 | 550 | 543 | 152 |
| 25 | 57 | 556 | 646 | 601 | 112 |
| 26 | 74 | 543 | 642 | 592 | 110 |
| 27 | 71 | 546 | 648 | 597 | 115 |
| 28 | 65 | 545 | 646 | 595 | 114 |
| 29 | 60 | 545 | 644 | 594 | 111 |
| 30 | 47 | 544 | 636 | 590 | 106 |
| 31[c] | 17 | 0 | 0 | 0 | 38 |
| 32 | 71 | 541 | 635 | 588 | 106 |
| 33 | 66 | 543 | 640 | 591 | 107 |
| 34 | 66 | 547 | 646 | 596 | 110 |
| 35 | 63 | 548 | 644 | 596 | 106 |
| 36 | 62 | 547 | 667 | 607 | 135 |
| 37[c] | 19 | 0 | 0 | 0 | 0 |
| 38 | 43 | 559 | 643 | 601 | 102 |
| 39 | 49 | 543 | 634 | 588 | 103 |
| 40 | 62 | 544 | 633 | 588 | 99 |
| 41 | 67 | 539 | 632 | 585 | 103 |
| 42 | 42 | 538 | 550 | 544 | 54 |
| 43 | 52 | 547 | 573 | 560 | 143 |
| 44 | 58 | 557 | 631 | 594 | 85 |
| 45 | 51 | 562 | 618 | 590 | 67 |

[a]Integrated area under reflection efficiency curve.
[b]At 20% reflection efficiency.
[c]Did not have reflection efficiency ≧20% for any wavelength.

These examples illustrate that a variety of TFE/VAc copolymers, optionally containing CTFE and vinyl alcohol as comonomers, are effective as binders in HRFs broad band behavior.

Examples 46–48

These examples demonstrate the effect of TAOBN in the diffusion elements.

The diffusion elements were prepared in similar fashion to those of Example 1 through 4, except a 356 μm doctor knife was used. Each had TFE/CTFE/VAc as binder (20.6 wt % TFE, 18.4 wt % CTFE, and 61 wt % VAc; inherent viscosity=1.54). The compositions are listed in Table 19.

Examples 46 through 48 were laminated to the imaged photosensitive element of Example 9 and heated to 120° C. for 2 hrs. The holographic results are summarized in Table 20.

TABLE 19

| | Example[a] | | |
|---|---|---|---|
| | 46 | 47 | 48 |
| Ingredient | Weight % | | |
| TFE/CTFE/VAc | 45.5 | 45.4 | 45.4 |
| TMPTMA | 35.2 | 35.2 | 35.1 |
| SR-454 | 8.1 | 8.1 | 8.0 |
| Brij ® 30 | 8.2 | 8.2 | 8.2 |
| MMT | 1.0 | 1.0 | 1.0 |
| o-Cl HABI | 2.0 | 2.0 | 2.0 |
| TAOBN | 0.0 | 0.1 | 0.3 |
| Thickness (μm) | 23.0 | 23.3 | 24.9 |

[a]Percent by weight of total solids.

TABLE 20

| Example | Area[a] (nm) | Minimum λ (nm) | Maximum λ (nm) | Midpoint λ (nm) | Bandwidth[b] (nm) |
|---|---|---|---|---|---|
| 46 | 58 | 591 | 689 | 640 | 98 |
| 47 | 84 | 588 | 731 | 659 | 143 |
| 48 | 76 | 600 | 739 | 669 | 139 |

[a]Integrated area under reflection efficiency curve.
[b]At 20% reflection efficiency.

Broadband behavior was observed with and without TAOBN; however, greater bandwidths resulted with use of diffusion elements containing TAOBN than for otherwise comparable diffusion elements without TAOBN as these examples illustrate.

Example 49

This example demonstrates the use of the scroll oven in processing laminates of the imaged photosensitive element and diffusion element.

The photosensitive element used was the same as that used in Example 16 and was similarly imaged using the apparatus described in Armstrong, U.S. Pat. No. 4,995,686 and was UV exposed in-line at 4 ft/min using 4 UV lamps (Sylvania F15T8/BL) providing 45 mJ/cm$^2$.

The imaged photosensitive element were then laminated to the same diffusion element used in Example 8. The laminates were then heated in the scroll oven at various residence times and temperatures.

The holographic results are summarized in Table 21. This example demonstrates the utility of the scroll oven in producing broad band holograms.

TABLE 21

| | Heating Time (min) | Area[a] (nm) | Minimum λ (nm) | Maximum λ (nm) | Midpoint λ (nm) | Bandwidth[b] (nm) |
|---|---|---|---|---|---|---|
| Temperature = 100° C., Samples A–D | | | | | | |
| A | 2 | 22 | 569 | 597 | 583 | 28 |
| B | 4 | 21 | 570 | 595 | 582 | 25 |
| C | 8 | 24 | 568 | 598 | 583 | 30 |
| D | 16 | 27 | 566 | 598 | 582 | 32 |
| Temperature = 110° C., Samples E–H | | | | | | |
| E | 2 | 20 | 567 | 591 | 579 | 24 |
| F | 4 | 24 | 570 | 598 | 584 | 28 |
| G | 8 | 28 | 563 | 597 | 580 | 34 |
| H | 16 | 26 | 569 | 602 | 585 | 33 |

TABLE 21-continued

| | Heating Time (min) | Area[a] (nm) | Minimum λ (nm) | Maximum λ (nm) | Midpoint λ (nm) | Bandwidth[b] (nm) |
|---|---|---|---|---|---|---|
| Temperature = 120° C., Samples I–L | | | | | | |
| I | 2 | 25 | 574 | 602 | 588 | 28 |
| J | 4 | 27 | 574 | 603 | 588 | 29 |
| K | 8 | 45 | 558 | 611 | 584 | 53 |
| L | 16 | 70 | 537 | 646 | 591 | 109 |
| Temperature = 135° C., Samples M–P | | | | | | |
| M | 2 | 50 | 549 | 622 | 585 | 73 |
| N | 4 | 62 | 534 | 639 | 586 | 105 |
| O | 8 | 66 | 529 | 645 | 587 | 116 |
| P | 16 | 70 | 522 | 643 | 582 | 121 |
| Temperature = 150° C., Samples Q–T | | | | | | |
| Q | 2 | 45 | 539 | 614 | 576 | 75 |
| R | 4 | 47 | 545 | 621 | 583 | 76 |
| S | 8 | 57 | 542 | 626 | 584 | 84 |
| T | 16 | 59 | 535 | 639 | 587 | 104 |

[a]Integrated area under reflection efficiency curve.
[b]At 20% reflection efficiency.

Example 50

A broad band hologram reflecting UV light (<400 nm) can be made by imaging the photosensitive element of Examples 1 through 4 in similar fashion except using a UV laser line, for example near 350 nm. Subsequent processing of the imaged photosensitive element with the diffusion element of Example 8 can give a broad band hologram centered in the 350 to 400 nm range.

What is claimed is:

1. A stable element comprising a photohardened photopolymer layer containing a broad band reflection hologram having a reflection bandwidth greater than 60 nm at 20% reflection efficiency, wherein the hologram containing photopolymer layer has been contacted with a diffusion element having a dry diffusion layer, the diffusion layer comprising a diffusible, thermally polymerizable monomer and a binder, the polymerizable monomer comprising at least twelve percent (12%) by weight and selected from the group consisting of a monomer that contains at least two methacrylate groups, pentaerythritol triacrylate, trimethylolpropane triacrylate, ethoxylated bisphenol A diacrylate, and hexamethylene diol diacrylate, diffusion between the dry diffusion layer and the hologram containing photopolymer layer has taken place, and the diffused monomer within the hologram containing photopolymer layer has been thermally polymerized.

2. The element of claim 1, wherein the bandwidth is greater than about 78 nm at 20% reflection efficiency.

3. The element of claim 1, wherein the hologram has a midpoint wavelength between about 330 and 1500 nm.

4. The element of claim 1, wherein the diffusion layer comprises 1,4,4-trimethyl-2,3-diazobicyclo-(3.2.2)-non-2-ene-2,3-dioxide.

5. The element of claim 1, wherein the diffusion layer consists of poly(methyl methacrylate) 32.4%; poly(vinyl acetate), 12.64%; trimethylolpropane trimethacrylate, 35.55%; triacrylate ester of ethoxylated trimethylolpropoane, 7.90%; 1,1'biimidazole, 2,2'-bis (o-chlorophenyl)-4,4'5,5'-tetraphenyl-dimer, 1.58%; 2-mercaptobenzoxazole, 0.71%; 2-(stilbyl)-(naphtho-1'.2',4, 5)-1,2,3-trizol-2"-sulfonic acid phenyl ester, 0.20% ; 3-phenyl-7-[2'-(4'-N,N-diethylamino)-6'chloro-1',3',5'-triazinylamino]coumarin, 0.99%; 2,2'-dihydroxy-4-methoxybenzophenone, 0.08%; polyoxyethylene lauryl ether, 7.9%; hydroquinone, 0.05%; and 1,4,4-trimethyl-2,3-diazobicyclo (3.2.2)-non-2-ene-2,3-dioxide, 0.03%, wherein the percentages of all components are expressed in weight percent.

6. The element of claim 1, wherein the hologram has at least a first area and at least a second area that reflect light in substantially the same manner when viewed under white light and that do not reflect light in the same manner when viewed under non white light.

7. The element of claim 1, wherein a first image is visible when the hologram is viewed under light having a first bandwidth and a second image is visible when the hologram is viewed under light having a second bandwidth.

8. A dry process for making a stable broad band reflection hologram in a photopolymer layer, the hologram having a final reflection bandwidth of at least 60 nm at 20% reflection efficiency, comprising:

imaging the photopolymer layer to form an imaged layer containing a reflection hologram having an initial reflection bandwidth less than the final bandwidth;

applying a dry diffusion layer of a diffusion element to the imaged layer and allowing diffusion to occur between the layers, the diffusion layer before application comprising a monomer present in a concentration at least twelve percent (12%) by weight and selected from the group consisting of a diffusible, thermally polymerizable monomer that contains at least two methacrylate groups, pentaerythritol triacrylate, trimethyolopropane triacrylate, ethoxylated bisphenol A diacrylate, and hexamethylene diol diacrylate; and heating the imaged layer with the applied diffusion layer at 100° C. or more for at least 2 minutes to form the broad band reflection hologram having the final bandwidth, wherein the diffused monomer within the reflection hologram so formed has been thermally polymerized.

9. The process of claim 8, further comprising removing the diffusion layer from the hologram.

10. The process of claim 8, wherein in the heating step the imaged layer with the applied diffusion layer is heated in a static oven or a scroll oven at a temperature in a range of about 100° C. to about 170° C.

11. The process step of claim 8, wherein, after the heating step, the hologram has a bandwidth greater than 78 nm and a midpoint wavelength located between 330 and 1500 nm.

12. The process of claim 8, further comprising curing the imaged, photopolymer photosensitive layer after the imaging step and before the applying step.

13. The process of claim 12, wherein the curing is accomplished in a pattern-wise fashion such that first areas are cured and second areas are selected from a group consisting of not cured and cured less than the first areas.

14. The process of claim 13, further comprising sensing the broad band reflection hologram under light having a first bandwidth and detecting a first image; and sensing the broad band reflection hologram under light having a second bandwidth and detecting a second image varying from the first image in shape, color, or other characteristic.

15. The process of claim 8, further comprising selecting the diffusion layer to comprise 1,4,4-trimethyl-2,3-diazobicyclo(3.2.2)-non-2-ene-2,3-dioxide.

16. The process of claim 8, further comprising selecting the diffusion layer to comprise poly(methyl methacrylate), 32.4%; poly(vinyl acetate), 12.64%; trimethylopropane trimethacrylate, 35.55%; triacrylate ester of ethoxyated trimethylopropoane, 7.90%; 1,1'biimidazole, 2,2'-bis(o-chlorophenyl)-4,4'5,5'-tetraphenyl-dimer, 1.58%; 2-mercaptobenzoxazole, 0.71%; 2-(stilbyl)-(naphtho-1',2',4,5)-1,2,3-trizol-2"sulfonic acid phenyl ester, 0.20% ; 3-phenyl-7-[2'-(4'-N,N-diethylamino)-6'chloro-1',3',5'-triazinylamino]-coumarin, 0.99%; 2,2'-dihydroxy-4-methoxybenzophenone, 0.08%; polyoxyethylene lauryl ether, 7.9%; hydroquinone, 0.05%; and 1,4,4-trimethyl-2,3-diazobicyclo(3.2.2)-non-2-ene-2,3-dioxide, 0.03%, wherein the percentages of all components are expressed in weight percent.

17. The process of claim 8, wherein the final bandwidth and a midpoint wavelength of the hologram after the heating step are controlled by carrying out at least one action item selected from a group consisting of varying the amount of the second monomer in the diffusion element, varying the duration of the heating step, and varying the cure prior to lamination.

* * * * *